(12) United States Patent
Rich et al.

(10) Patent No.: US 7,856,347 B2
(45) Date of Patent: *Dec. 21, 2010

(54) FACILITATING SIMULATION OF A MODEL WITHIN A DISTRIBUTED ENVIRONMENT

(75) Inventors: Marvin J. Rich, Poughkeepsie, NY (US); William K. Mellors, Clinton Corners, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

This patent is subject to a terminal disclaimer.

(21) Appl. No.: 12/181,843

(22) Filed: Jul. 29, 2008

(65) Prior Publication Data

US 2008/0294416 A1    Nov. 27, 2008

Related U.S. Application Data

(63) Continuation of application No. 11/464,009, filed on Aug. 11, 2006, now Pat. No. 7,444,277, which is a continuation of application No. 10/124,982, filed on Apr. 18, 2002, now Pat. No. 7,158,925.

(51) Int. Cl.
*G06G 7/62* (2006.01)
*G06F 9/45* (2006.01)

(52) U.S. Cl. .............................. 703/17; 716/7
(58) Field of Classification Search ............ 703/17; 716/7

See application file for complete search history.

(56) References Cited

U.S. PATENT DOCUMENTS

| | | | |
|---|---|---|---|
| 4,914,612 A | 4/1990 | Beece et al. | |
| 5,146,460 A | 9/1992 | Ackerman et al. | |
| 5,247,650 A | 9/1993 | Judd et al. | |
| 5,384,720 A | 1/1995 | Ku et al. | |
| 5,440,697 A | 8/1995 | Boegel et al. | |
| 5,442,772 A | 8/1995 | Childs et al. | |
| 5,475,830 A | 12/1995 | Chen et al. | |
| 5,519,848 A | 5/1996 | Wloka et al. | |
| 5,561,787 A | 10/1996 | Amorim et al. | |

(Continued)

FOREIGN PATENT DOCUMENTS

CA    2048140    1/1993

(Continued)

OTHER PUBLICATIONS

"Parallel Event-Driven Simulation," IBM Technical Disclosure Bulletin, R.F. Damiano and J.H. Kukula, vol. 33, No. 3A, Aug. 1990, pp. 336-339.

(Continued)

*Primary Examiner*—Paul L Rodriguez
*Assistant Examiner*—Juan C Ochoa
(74) *Attorney, Agent, or Firm*—Steven Chiu; Blanche E. Schiller, Esq.; Heslin Rothenberg Farley & Mesiti P.C.

(57) ABSTRACT

Simulation of models within a distributed environment is facilitated. A model is partitioned based on clock domains, and communication between partitions on different processors is performed on synchronous clock boundaries. Further, data is exchanged across the network on latch boundaries. Thus, management aspects of the simulation, such as management associated with the global simulation time, are simplified.

16 Claims, 28 Drawing Sheets

U.S. PATENT DOCUMENTS

| | | | |
|---|---|---|---|
| 5,570,045 | A | 10/1996 | Erdal et al. |
| 5,621,670 | A | 4/1997 | Maeda et al. |
| 5,625,823 | A | 4/1997 | Debenedictis et al. |
| 5,649,164 | A | 7/1997 | Childs et al. |
| 5,673,199 | A | 9/1997 | Gentry |
| 5,691,662 | A | 11/1997 | Sobleski et al. |
| 5,701,439 | A | 12/1997 | James et al. |
| 5,794,005 | A | 8/1998 | Steinman |
| 5,801,938 | A | 9/1998 | Kalantery |
| 5,862,361 | A | 1/1999 | Jain |
| 5,881,267 | A | 3/1999 | Dearth et al. |
| 5,919,250 | A | 7/1999 | Shimokawa |
| 5,933,794 | A | 8/1999 | Stalzer |
| 5,956,261 | A | 9/1999 | Blaauw et al. |
| 6,006,027 | A | 12/1999 | Downey |
| 6,074,427 | A | 6/2000 | Fought et al. |
| 6,106,568 | A | 8/2000 | Beausang et al. |
| 6,108,494 | A | 8/2000 | Eisenhofer et al. |
| 6,110,217 | A | 8/2000 | Kazmierski et al. |
| 6,134,514 | A | 10/2000 | Liu et al. |
| 6,195,628 | B1 | 2/2001 | Blaauw et al. |
| 6,278,963 | B1 | 8/2001 | Cohen |
| 6,339,836 | B1 | 1/2002 | Eisenhofer et al. |
| 6,434,733 | B1 | 8/2002 | Duggirala et al. |
| 6,567,962 | B2 | 5/2003 | Baumgartner et al. |
| 6,658,636 | B2 | 12/2003 | Hochapfel |
| 7,124,071 | B2 | 10/2006 | Rich et al. |
| 7,158,925 | B2 | 1/2007 | Rich et al. |
| 7,231,334 | B2 | 6/2007 | Mellors et al. |
| 7,444,277 | B2 | 10/2008 | Rich et al. |
| 2002/0052725 | A1 | 5/2002 | Wasynczuk et al. |

FOREIGN PATENT DOCUMENTS

| | | |
|---|---|---|
| EP | 1059593 A2 | 12/2000 |

OTHER PUBLICATIONS

"Hardware Description Language Modeling for Analog-Digital Hardware Designs," IBM Technical Disclosure Bulletin, M.W. Brown and B.R. Stanisic, vol. 33, No. 6A, Nov. 1990, pp. 112-116.

"Parallel and Distributed Simulation," Richard M. Mujimoto, Proceedings of the 1999 Winter Simulation Conference, College of Computing, Georgia Institute of Technology, pp. 122-131.

"High Performance Parallel Logic Simulation on a Network of Workstations," Naraig Manjikian and Wayne M. Loucks, Proc. 7th Workshop on Parallel and Distributed Simuation (PADS), vol. 23, No. 1, pp. 76-84, 1993.

"Logic Verification of Very Large Circuits Using Shark," Casas et al., VLSI Design, 1999, Proceedings, 12th International Conference on Jan. 7-10, 1999, pp. 310-317.

Van Almsick, Werner, et al., "Distributed Simulation for Structural CHDL Netlists," European Design Automation Conference with EURO-VHDL '94, Sep. 19-23, 1994, pp. 598-603.

Koch, Michael et al., "Partitioning of VHDL Models for a Distributed Simulation in a Workstation Cluster," Systems Analysis Modeling Simulation, Jun. 26-30, 1995, pp. 595-598.

Cesa, L.J. et al., "Coupled Distributed Parallel Simulation," IBM Technical Disclosure Bulletin, vol. 34, No. 10A, Mar. 1992, pp. 273-277.

Smith, Douglas, J., "HDL Chip Design", Doone Publications, Madison, AL., 1996, pp. 39.

Beece, D.K. et al., "Packing Algorithm for Massively Distributed Simulation Engine," IBM Technical Disclosure Bulletin, vol. 34, No. 11, Apr. 1992, pp. 62-67.

Chiola, G., et al., "Exploiting Timed Petri Net Properties for Distributed Simulation Partitioning," Proceedings of the Twenty-Sixth Hawaii International Conference on System Sciences, Wailea, Jan. 5-8, 1993, vol. 2, pp. 194-203.

Weimin, Xu, "A Research of Distributed Discrete Event Simulation System: Processes Scheduling and Communication," Beijing International Conference on System Simulation and Scientific Computing, Beijing, Oct. 23-26, 1989, vol. 1, pp. 382-386.

Salama, Roberto et al., "dCONES: A Distributed Concurrent Environment for VLSI Circuit Simulation," SCS Multiconference on Multiprocessors and Array Processors, San Diego, Feb. 3-4, 1988, Proceedings of MAPCON IV: Special Processing, pp. 39-43.

Hou, T.Y. et al., "A Hybrid Model for Distributed and Concurrent Simulation," SCS Multiconference on Distributed Simulation, San Diego, Feb. 3-5, 1988, Proceedings of Distributed Simulation 1988, pp. 21-24.

Office Action for U.S. Patent No. 7,231,334 dated Oct. 18, 2005.
Final Office Action for U.S. Patent No. 7,231,334 dated Mar. 9, 2006.
Office Action for U.S. Patent No. 7,231,334 dated Oct. 13, 2006.
Office Action for U.S. Patent No. 7,124,071 dated Nov. 1, 2005.
Office Action for U.S. Patent No. 7,158,925 dated Nov. 1, 2005.
Final Office Action for U.S. Patent No. 7,158,925 dated Jun. 20, 2006.
Office Action for U.S. Patent No. 7,444,277 dated May 4, 2007.
Final Office Action for U.S. Patent No. 7,444,277 dated Oct. 30, 2007.

| CLOCK DOMAIN | CLOCK FREQUENCY | CLOCK DOMAIN INTERFACES |
|---|---|---|
| 1 | 500 MHz | 2 |
| 2 | 250 MHz | 3,1 |
| *3 | 125 MHz | 2,4 |
| 4 | 200 MHz | 3,5 |
| 5 | 750 MHz | 4 |

* = OPTIMAL CLOCK DOMAIN TO MINIMIZE GST MANAGEMENT

*fig. 16C*

FACILITATING SIMULATION OF A MODEL WITHIN A DISTRIBUTED ENVIRONMENT

CROSS-REFERENCE TO RELATED APPLICATIONS

This application is a continuation of co-pending U.S. patent application Ser. No. 11/464,009, filed Aug. 11, 2006, entitled "Facilitating Simulation of a Model Within a Distributed Environment," by Rich et al., which is a continuation of U.S. Pat. No. 7,158,925, issued Jan. 2, 2007, entitled "Facilitating Simulation of a Model Within a Distributed Environment," by Rich et al., the entirety of each being incorporated herein by reference.

This application contains subject matter which is related to the subject matter of the following applications, each of which is assigned to the same assignee as this application. Each of the below listed applications is hereby incorporated herein by reference in its entirety:

"Coupler Interface for Facilitating Distributed Simulation of a Partitioned Logic Design", Mellors et al., U.S. Pat. No. 7,231,334, issued Jun. 12, 2007; and "Partitioning a Model Into a Plurality of Independent Partitions to be Processed Within a Distributed Environment", Rich et al., U.S. Pat. No. 7,124,071, issued Oct. 17, 2006.

TECHNICAL FIELD

This invention relates, in general, to model simulation, and in particular, to facilitating the simulation of models in a distributed environment.

BACKGROUND OF THE INVENTION

Model simulation provides a mechanism by which the design of a component (e.g., the design of a hardware chip) can be tested prior to building the component. This testing is to ensure that the component, once built, will meet the desired specifications of the component. The component is tested by creating a model of the component and simulating the model. There are various types of model simulation, including event simulation and cycle simulation. Event simulation takes into account delays within the component (e.g., hardware delays), whereas cycle simulation ignores such delays.

Components, such as logic chips, to be modeled are being developed with ever increasing density and functionality. In fact, the state of the art is evolving to the point where chip capabilities are being characterized as System on Chip (SoC). This increased amount of functionality requires equally proportional improvements in the simulation methodologies used to ensure the proper operation of the components prior to their manufacture. An evolving category of simulation methodologies used to address this concern is distributed event simulation. In distributed event simulation, the horsepower of a set of independent workstations or processors is harnessed to tackle a large or complex chip model. Specifically, the simulation effort is distributed across a set of processors.

For proper simulation of a model across the set of processors, a global simulation time (GST) is employed to control the progression of the simulation. Each processor performs the simulation up to the GST time, and then, waits for a further directive. During the simulation to that time, complex management associated with the GST is needed to ensure that data is exchanged between the processors accurately and coherently.

Different management techniques have been used in the past to manage the GST, including optimistic prediction and conservative advancement of the GST. However, both techniques have proven inadequate for distributed event simulation of complex models, such as dense chips. In particular, as the densities of the chips have increased and as simulation of the dense chips has progressed to distributed simulation, in which several clocks are typically communicating across a network on asynchronous boundaries, the management associated with the GST has become very complex. This complexity is further exacerbated by the use of actual delays present in event simulation.

Therefore, a need exists for a capability that simplifies the management associated with global simulation time. In particular, a need exists for a capability that facilitates simulation of models in a distributed environment. A yet further need exists for a capability that facilitates simulation of models via distributed event simulation.

SUMMARY OF THE INVENTION

The shortcomings of the prior art are overcome and additional advantages are provided through the provision of a system of managing partition groups of a model. The system includes, for instance, a plurality of partition groups of a model to be simulated, the plurality of partition groups corresponding to a plurality of clock domains; means for deriving an exchange point to be used in exchanging data between two partition groups of the plurality of partition groups on at least one latch boundary; means for exchanging data between the two partition groups, wherein one partition group of the two partition groups includes one latch having one clock associated therewith and another partition group of the two partition groups includes another latch having another clock associated therewith, wherein the one clock arrives at the one latch at one time and the another clock arrives at the another latch at another time, the one time varying from the another time, and wherein the respective times are preserved in exchanging the data; and means for advancing a global simulation time, in response to the exchanging of data, the global simulation time controlling a progression of simulation of the model.

Computer program products and/or methods corresponding to the above-summarized claim are also described and may be claimed herein.

Advantageously, one or more aspects of the present invention facilitate simulation of models in a distributed environment. More particularly, one or more aspects of the present invention facilitate simulation of models in a distributed environment using distributed event simulation.

In one aspect, a partitioning capability is provided, which partitions a model based on clock domains. The partitioning capability adjusts one or more partitions to enable communication between processors across a network to be performed on synchronous clock boundaries. Further, the partitioning capability also provides for data exchanges across the network to be performed on latch boundaries. These benefits of the partitioning capability facilitate distributed simulation. Further, simulation performance is enhanced and complexity associated with distributed simulation, such as the complexity associated with global management of the global simulation time, is greatly simplified.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 16c depicts one example of an optimal clock domain, in accordance with an aspect of the present invention;

BEST MODE FOR CARRYING OUT THE INVENTION

In accordance with an aspect of the present invention, simulation of a model (e.g., a chip) in a distributed environment is facilitated. In one aspect, a partitioning protocol is provided, which enhances performance and reduces complexity associated with performing distributed simulation. For example, global management associated with a global simulation time used to control progression of the simulation is greatly simplified.

As one example, the partitioning protocol partitions a model based on clock domains. It further adjusts the partitions to enable communication between partitions across a network to be performed on synchronous clock boundaries. Yet further, it enables data to be exchanged between the partitions on latch boundaries.

Figure 1:
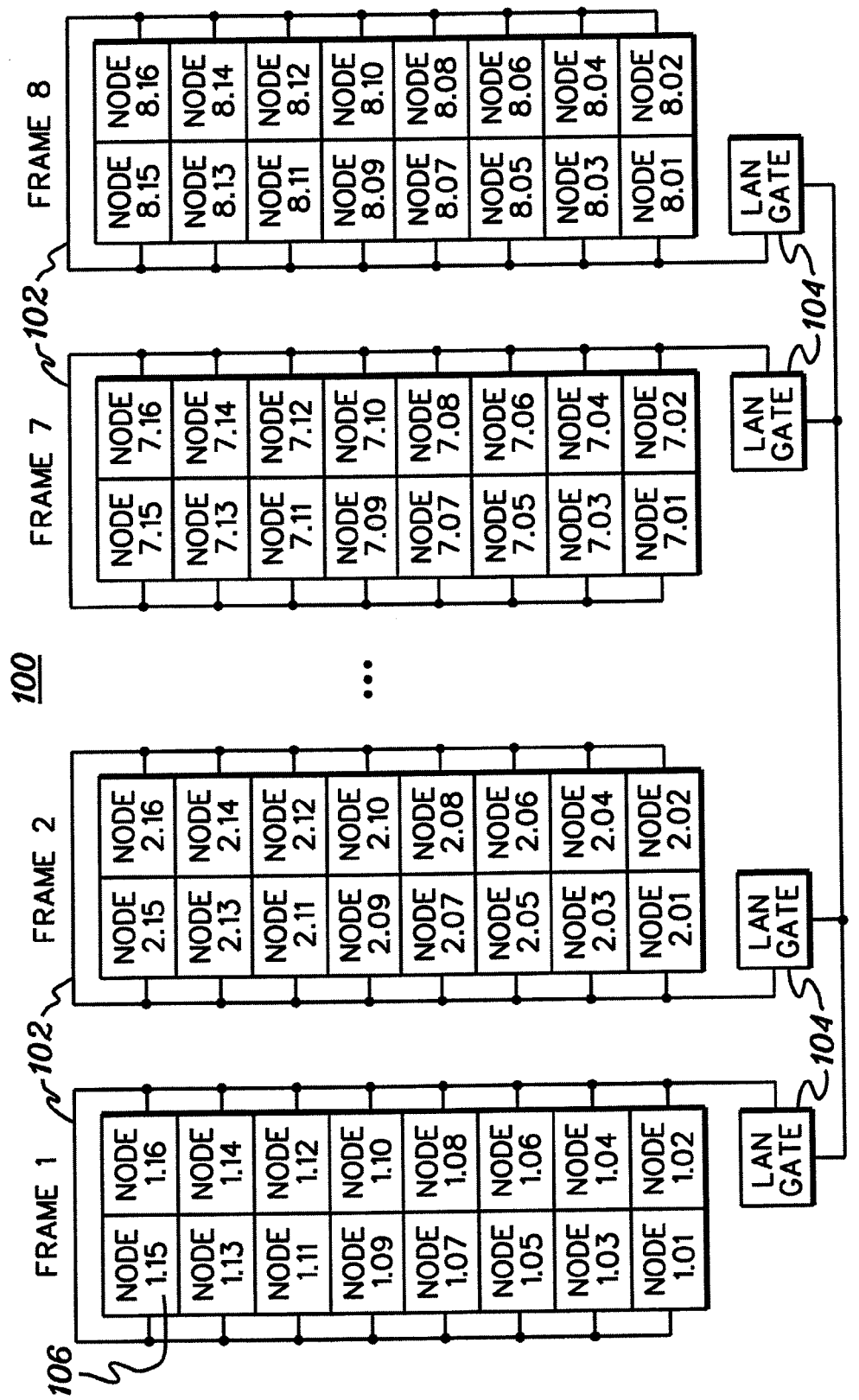
FIG. 1 depicts one embodiment of a distributed computing environment incorporating and using one or more aspects of the present invention.

One embodiment of a distributed computing environment incorporating and using one or more aspects of the present invention is depicted in FIG. 1. In one example, distributed computing environment 100 includes, for instance, a plurality of frames 102 coupled to one another via a plurality of LAN gates 104, each of which is described below.

In one example, distributed computing environment 100 includes eight (8) frames, each of which includes a plurality of processors 106 (a.k.a., processing nodes). In one instance, each frame includes sixteen (16) processors, and each processor is, for instance, a RISC/6000 computer running AIX, a UNIX based operating system. Each processor within a frame is coupled to the other processors of the frame via, for example, an internal LAN connection. Additionally, each frame is coupled to the other frames via LAN gates 104.

As examples, each LAN gate 104 includes either a RISC/6000 computer, any computer network connection to the LAN, or a network router. However, these are only examples. It will be apparent to those skilled in the relevant art that there are other types of LAN gates, and that other mechanisms can also be used to couple the frames to one another.

In addition to the above, the distributed computing environment of FIG. 1 is only one example. It is possible to have more or less than eight frames, or more or less than sixteen nodes per frame. Further, the processors do not have to be RISC/6000 computers running AIX. Some or all of the processors can include different types of computers and/or different operating systems. All of these variations are considered a part of the claimed invention.

A plurality of the processors of the distributed computing environment are used, in accordance with an aspect of the present invention, to run a simulation of a model to verify whether the design of the model satisfies its design specifications. In the particular example described herein, the model represents the functionality of a chip; however, aspects of the invention are not limited to such a model type. One or more aspects of the present invention can be employed to simulate other types of models, such as processes, etc.

Figure 2:
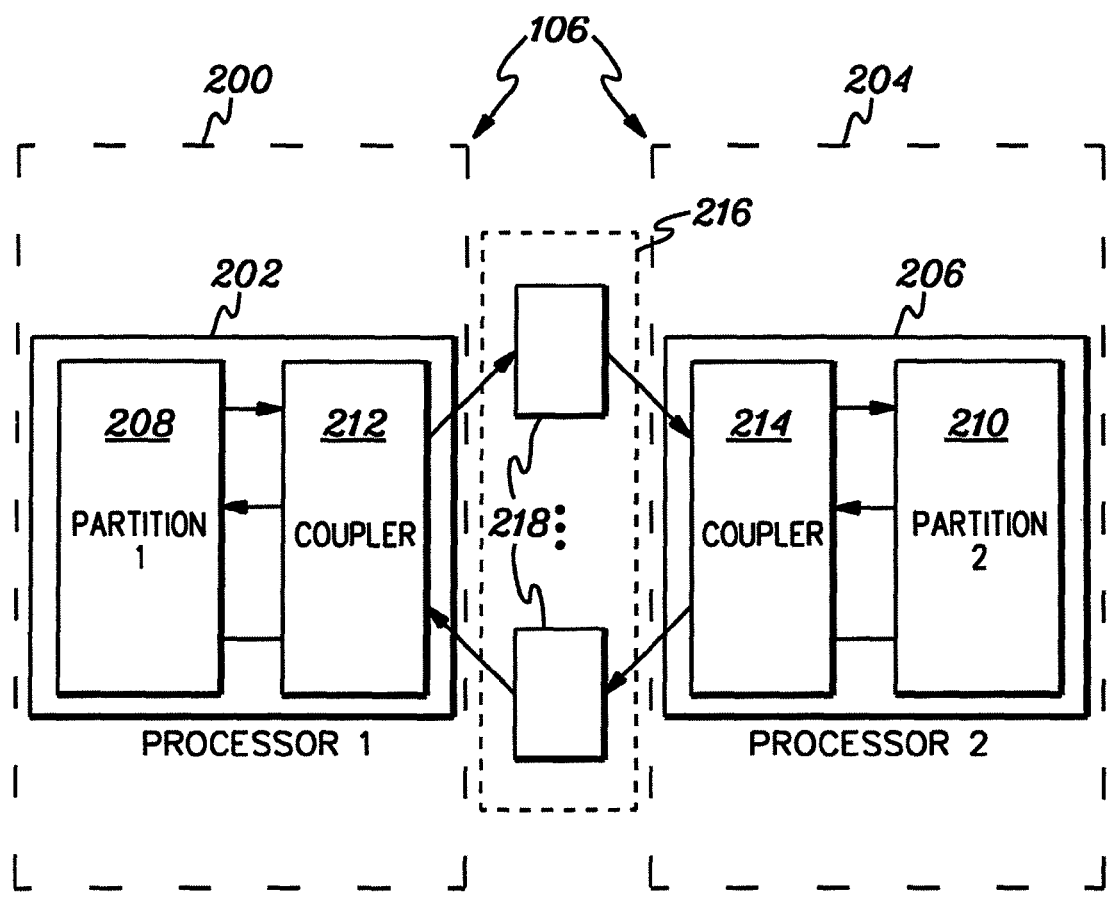
FIG. 2 depicts one example of a plurality of simulators executing on a plurality of the processors of FIG. 1, in accordance with an aspect of the present invention.

Each processor 106 of the distributed computing environment to run the simulation includes a simulator. For instance, as depicted in FIG. 2, processor 200 executes an instance of a licensed hardware simulator 202, and another processor 204 executes an instance of a licensed hardware simulator 206. Although two processors having simulators are depicted, it is understood that any number of the processors within the environment may execute simulators.

In one embodiment, instances 202 and 206 are instances of different licensed hardware simulators, such as VSIM, offered by Model Technology Inc. of Portland, Oreg., and PSIM, offered by International Business Machines Corporation, Armonk, N.Y. In another embodiment, however, instances 202 and 206 may be instances of the same licensed hardware simulator.

The simulators used for one or more aspects of the present invention are event simulators; although, other simulators may be used. Event simulators can accurately model the operation of a wide variety of logic design styles (e.g., synchronous, asynchronous, self-timed) that can exist in a particular design. In one example, the event simulators implement the Institute of Electrical and Electronics Engineers (IEEE) Very High Speed Integrated Circuits (VHSIC) Hardware Description Language (VHDL) Initiative Towards ASIC Libraries (VITAL) standard, which provides a capability to back annotate timing delays onto technology gate models in VHDL.

In accordance with an aspect of the present invention, at least one simulator includes logic to partition a model into a plurality of partitions, which are then processed on a plurality of processors by the simulators associated with those processors. For example, instance 202 processes a partition 208, and instance 206 processes a partition 210.

In one embodiment, the partitions are coupled to one another via couplers and a communications medium. For instance, partition 208 is coupled to a coupler 212 and partition 210 is coupled to a coupler 214. The couplers communicate with one another via a communications medium 216.

The communications medium includes, for instance, a storage device using the Andrew File System (AFS), offered by International Business Machines Corporation, Armonk, N.Y. AFS is a distributed file system that enables the cooperating host to efficiently share file system resources across both local area and wide area networks. In one example, the storage device includes a common communication directory (CCD). The CCD includes a plurality of files 218, which are read and write accessible by couplers 212 and 214. The plurality of files 218 are used to transmit data between partitions 208 and 210 via couplers 212 and 214. Further details of the communication between partitions are described in a co-filed U.S. Patent Application, entitled "COUPLER INTERFACE FOR FACILITATING DISTRIBUTED SIMULATION OF A PARTITIONED LOGIC DESIGN", Mellors et al., which is hereby incorporated herein by reference in its entirety.

Figure 3A:
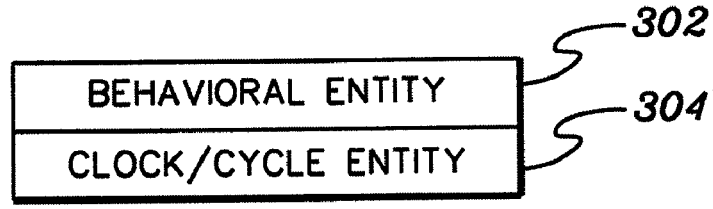
FIG. 3a depicts one embodiment of various entities of a model to be partitioned, in accordance with an aspect of the present invention.

A model includes a plurality of entities, and thus, in partitioning the model, each of the model's entities may be partitioned. In one example, a model 300 (FIG. 3a) includes a behavioral entity 302 and a clock/cycle entity 304. Clock/cycle entity 304 determines when elements of behavioral entity 302 can change.

For a model that represents an ASIC chip design, the behavioral components include, for instance, latches, gates and/or wires; and the clock/cycle entity includes, for instance, a clock waveform value on clock distribution wires. Behavioral elements take on new values and launch new values based on cycles of the clock waveform. Clock events, such as waveform rises, are utilized by event-driven applications; whereas cycle-driven applications utilize clock/cycle transitions.

A model may be represented by a netlist and/or VHDL, which is a standard (e.g., VHDL-1076) developed by IEEE. The netlist includes, for example, instances of the logic gates (e.g., latches and combinatorial), along with input and output nets for each gate, such that gate connections are defined (e.g., common net name from Gate A output to Gate B input, as one example). Any logic related to clocks also appear in the netlist, as gates with connecting nets.

Figure 3B:
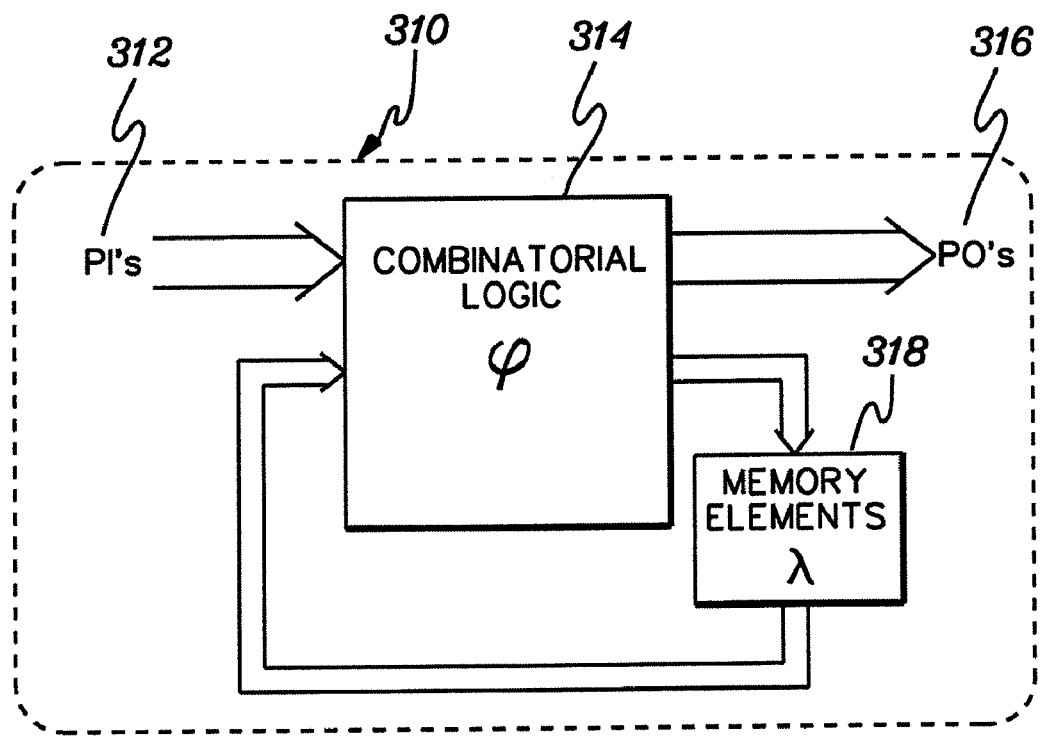
FIG. 3b depicts a Meeley state machine representation of a model to be partitioned, in accordance with an aspect of the present invention.

A model may also be represented by a Meeley state machine, such as the one depicted in FIG. 3b. As shown in FIG. 3b, the Meeley state machine representation of a model 310 includes, for instance, one or more primary inputs 312 to combinatorial logic 314 (e.g., AND, OR gates); one or more primary outputs 316 of the combinatorial logic; and one or more memory elements 318 (e.g., sequential logic, such as latches). The memory elements typically have a clock associated therewith. Further, the memory elements provide the state of the model. In particular, the memory elements remember certain status, which is fed back into the combinatorial logic. Then, based on the combinatorial logic and primary inputs, primary outputs are provided, which represent functions of the model.

A model may be simulated in different types of environments, including distributed environments. With distributed simulation (e.g., distributed event simulation), management of aspects of the simulation (e.g., management associated with the GST) tends to be complex. This is due to the varying clock domains within the model, as well as the inherent complexities associated with exchanging data across asynchronous clock boundaries. Thus, one or more capabilities are provided herein to facilitate the simulation of models in a distributed environment.

In accordance with an aspect of the present invention, distributed simulation is facilitated by partitioning the model based on clock domains, and then, removing the asynchronous clock boundaries across a network. This greatly simplifies, and practically eliminates, certain management aspects of the simulation, such as the global management associated with GST.

An overview of one embodiment of the logic associated with partitioning a model to facilitate distributed simulation of the model is described with reference to FIG. 4. The examples described herein relate to the partitioning of a chip (e.g., a complex and/or large ASIC hardware chip); however, one or more aspects of the present invention are applicable to the partitioning of other models, as well, and therefore, are not limited to the partitioning of a chip.

Figure 4:
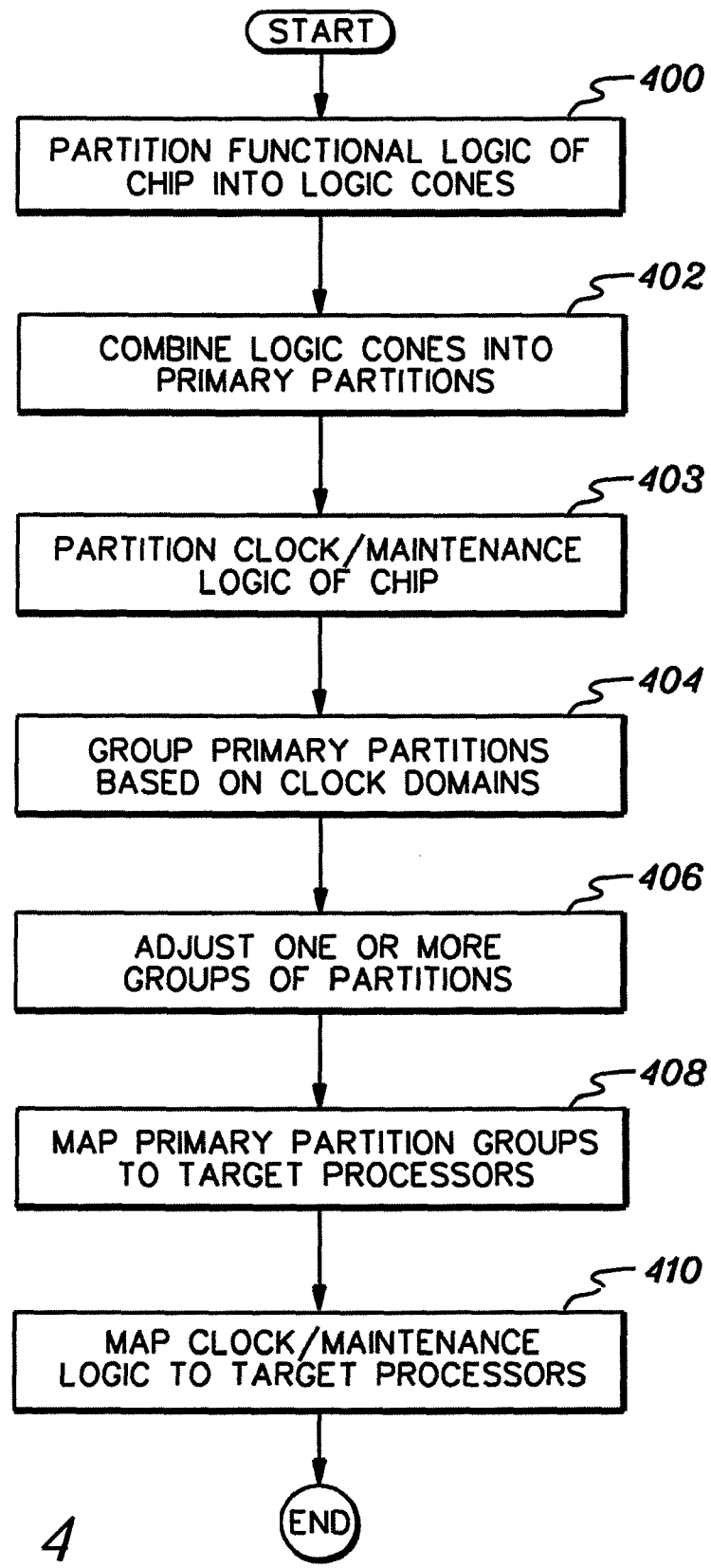
FIG. 4 depicts one embodiment of the logic used to partition a model, in accordance with an aspect of the present invention.

Referring to FIG. 4, when a model (e.g., a chip) to be partitioned is obtained (e.g., provided, received, created, have), an initial step in the partitioning of that chip includes partitioning the functional logic of the chip, which corresponds to the data pins, into a plurality of logic units, such as a plurality of cones of logic, STEP 400. Each cone of logic includes one memory element (e.g., a latch) and the combinatorial logic associated with that memory element, if any.

The partitioning of the functional logic of the chip produces one or more latch ids (latch_IDs) for the one or more latches of the chip, as described in further detail below.

Thereafter, the cones of logic are combined into a plurality of primary partitions, STEP 402. A primary partition may include one or more cones of logic. For example, a primary partition may include only one cone of logic, if that cone of logic does not intersect with any other cones of logic; or it may include multiple cones of logic, if that cone of logic intersects with one or more other cones of logic.

Subsequent to determining the primary partitions for the functional logic of the chip, other logic of the chip, if any, such as clock/maintenance logic (which corresponds to clock pins), is partitioned to determine the clock/maintenance logic associated with the primary partitions, STEP 403. The partitioning of the clock/maintenance logic associates each gate or latch of the clock/maintenance logic to a set of one or more functional latches, by placing an appropriate Latch_ID value in a separate CLK_ID field. This information can then be used to derive the clock/maintenance logic associated with a primary partition. In one example, each latch may have one or more clocks driving the latch.

After associating the clock/maintenance logic with the primary partitions, the primary partitions are grouped into one or more groups of primary partitions, STEP 404. In one example, the grouping is based on clock domains; however, this is only one example. In other embodiments, the grouping may be based on other factors or considerations, or there may be no grouping at all.

After grouping the primary partitions, one or more of the grouped partitions are adjusted to eliminate asynchronous clock boundaries across the network, STEP 406. In one example, the adjusting is based on a selected policy. For instance, one policy may include combining groups of partitions to have as few groups as possible; while another policy may favor maintaining the groups, but adding an interface to one or more groups to obtain the desired effect.

Next, the groups of partitions are mapped to an arbitrary set of target processors, in accordance with a chosen mapping policy, STEP 408. The policy used for the mapping can be selected irrespective of the partitioning. Additionally, the number of processors selected is independent of the partitioning, and can vary with the chosen policy and with each simulation.

Subsequently, other logic of the chip, such as the clock and maintenance logic, is mapped to the target processors, STEP 410.

Further details regarding the partitioning of a chip to facilitate distributed simulation of the chip are described with reference to FIGS. 5-22b. In particular, the partitioning of the functional logic of the chip into cones of logic is described with reference to FIGS. 5-7; the combining of the cones of logic into primary partitions is described with reference to FIG. 8; the partitioning of other logic of the chip, such as the clock/maintenance logic, is described with reference to FIGS. 9a-10; the grouping of the primary partitions is described with reference to FIGS. 11-12b; the adjusting of primary partitions is described with reference to FIGS. 13a-16c; the mapping of the primary partitions to target processors is described with reference to FIGS. 17a-17b; the mapping of the clock and maintenance logic of the chip to target processors is described with reference to FIG. 18a-18b; the management of GST is described with reference to FIGS. 19a-19b; and the exchange of data is described with reference to FIGS. 20a-22b.

Figure 5:
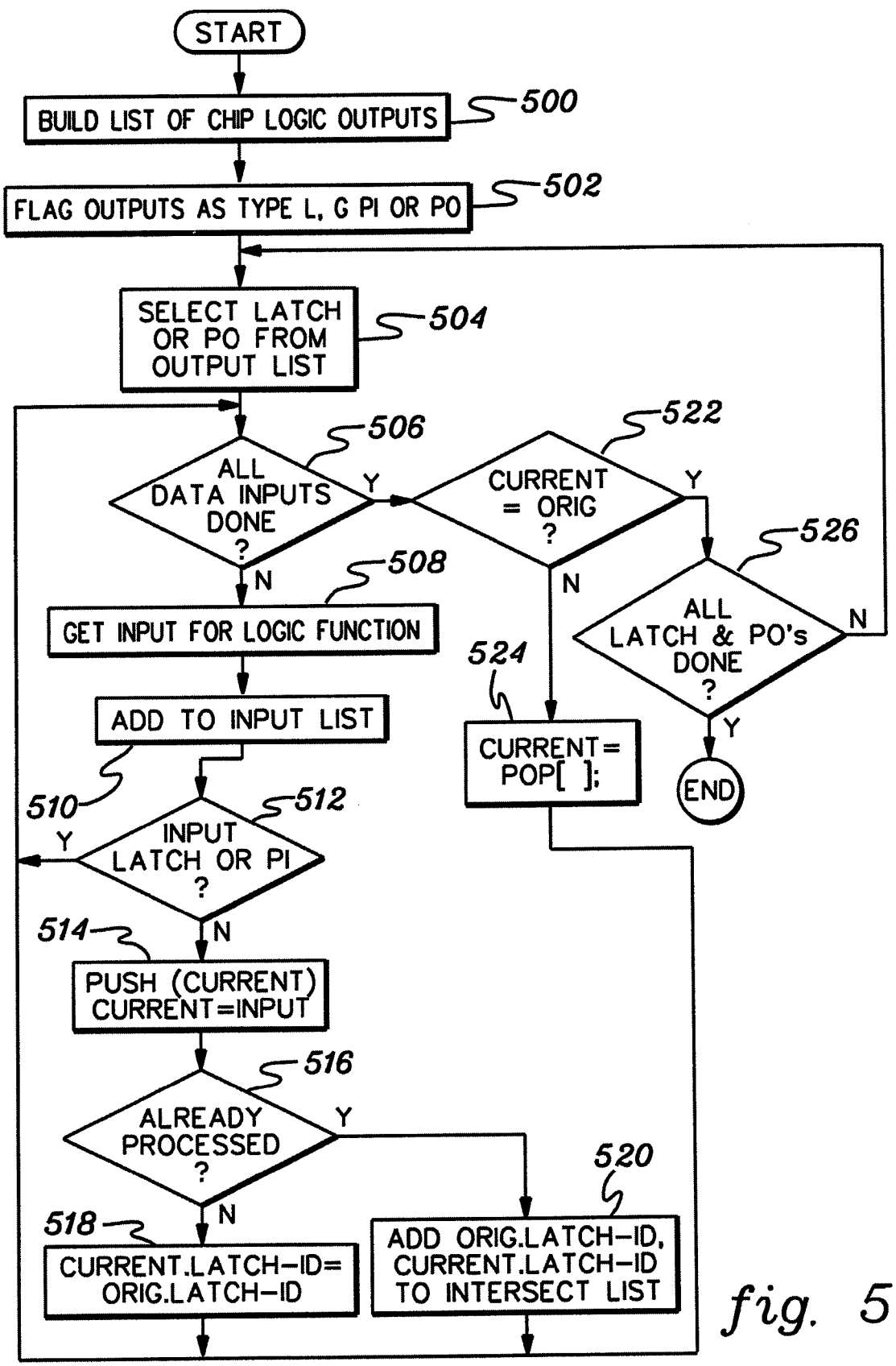
FIG. 5 depicts one embodiment of the logic associated with a partitioning step of FIG. 4, in which the functional logic of the model is partitioned into a plurality of cones of logic, in accordance with an aspect of the present invention.

One embodiment of the logic associated with partitioning a chip into a plurality of cones of logic is described with reference to FIG. 5. Initially, a list of chip logic outputs is built, STEP 500. In one example, this output list is generated from the netlist associated with the chip, which identifies the various logic elements of the chip. One example of an output list 600 is depicted in FIG. 6.

Figure 6:
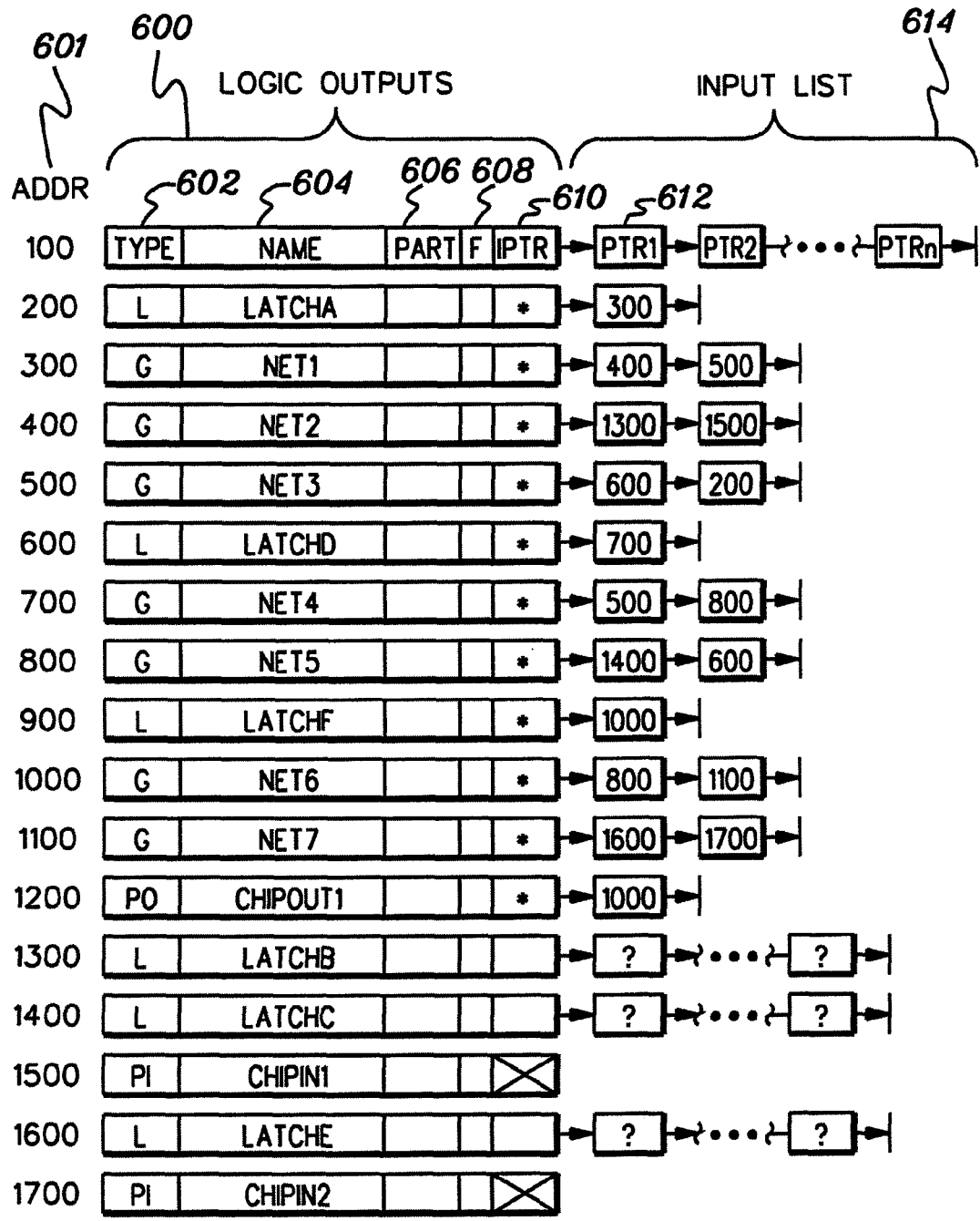
FIG. 6 depicts one embodiment of the logic outputs for a sample portion of a model, and an input list generated in accordance with an aspect of the present invention.
Figure 7:
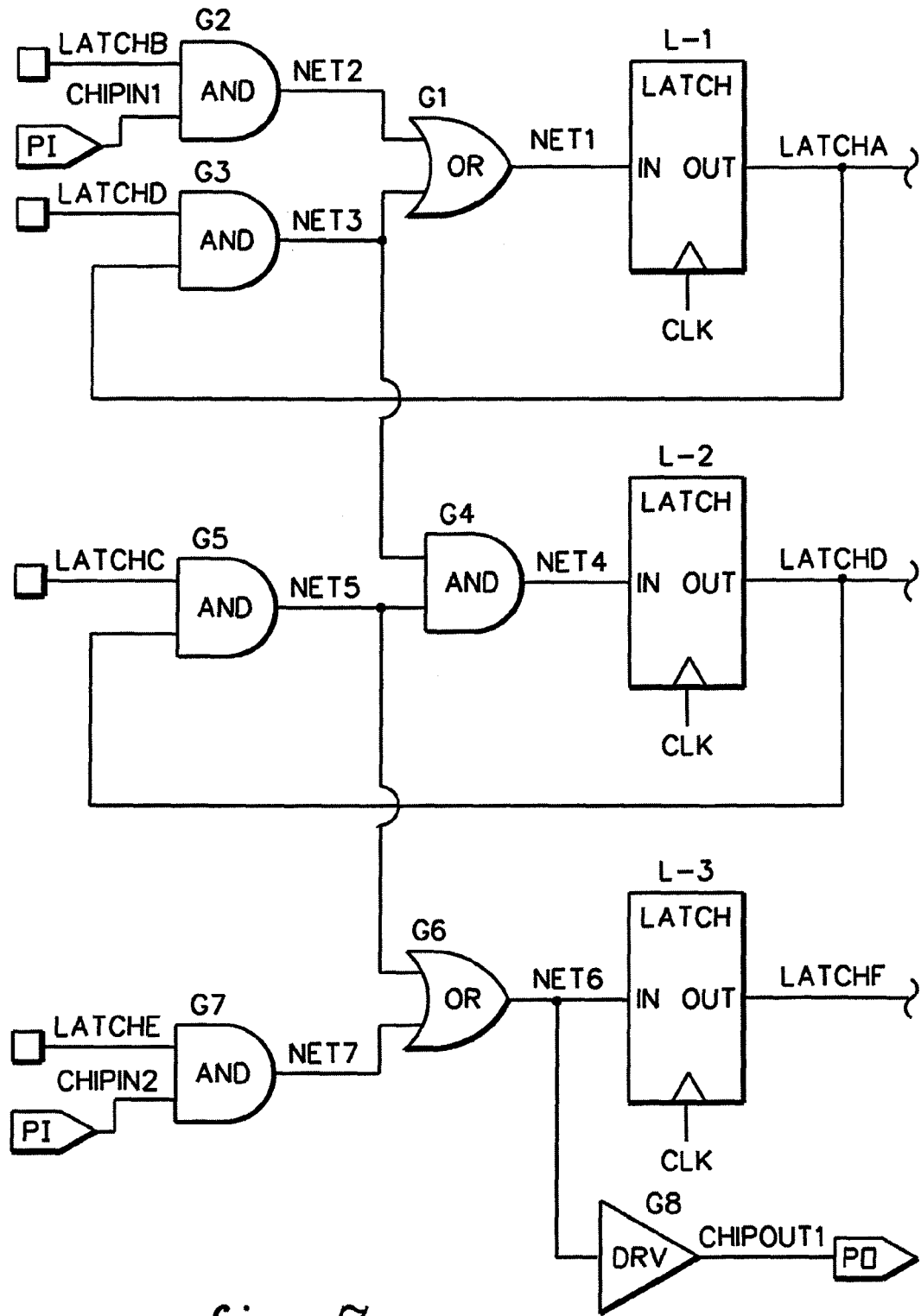
FIG. 7 depicts one embodiment of the combinatorial logic and latches of the sample model portion of FIG. 6, in accordance with an aspect of the present invention.
Figure 8:
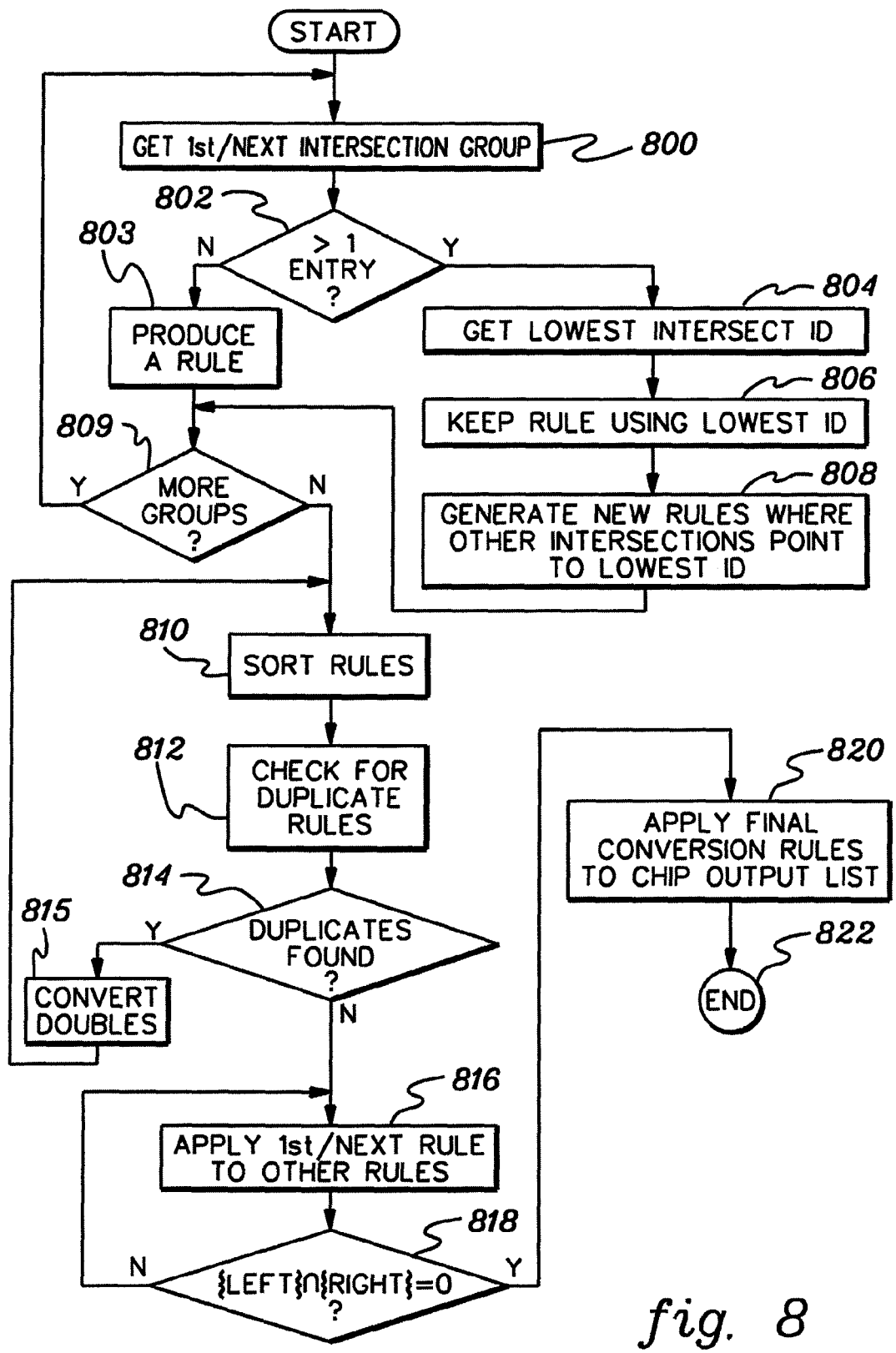
FIG. 8 depicts one embodiment of the logic associated with combining the cones of logic of FIG. 5 into a plurality of primary partitions, in accordance with an aspect of the present invention.

The output list of FIG. 6 depicts various of the logic outputs for a sample portion of a chip depicted in FIG. 7. As shown, output list 600 includes a plurality of entries, each of which is addressed by an address 601 and each of which has, for instance, a type field 602 indicating whether the logic element is a latch (L), a gate (G), a primary input (PI), or a primary output (PO); a name field 604 indicating the name of the logic element; a part field 606, which includes partitioning specific information, such as values of variables used in the partitioning; a flag field 608 indicating whether all inputs of the particular logic element have been processed; and a pointer 610, which points to a linked list of pointers 612 of inputs driving the particular element.

Returning to FIG. 5, subsequent to building the output list, the type of each output (e.g., latch, gate, primary input, or primary output) is provided by filling in type field 602, STEP 502.

Next, a latch or primary output is selected from the output list, STEP 504. Additionally, a variable referred to as Current is set equal to the selected output, a variable referred to as Origin is set equal to Current, and a variable referred to as Orig.Latch-Id is initialized to a number, such as one.

Thereafter, a determination is made as to whether all the data inputs for that selected latch or primary output have been processed, INQUIRY 506. For example, assume that Latch A of FIGS. 6 and 7 is selected. Then, a determination is made as to whether the input of Latch A (e.g., Net 1, address 300) has been added to an input list 614 (FIG. 6). Since in this example, no inputs have been processed yet, the input of the selected logic element is obtained (e.g., Net 1), STEP 508, and its address (e.g., 300) is added to input list 614, STEP 510.

Subsequently, a determination is made as to whether the input (e.g., Net 1) is a latch or a PI, INQUIRY 512. If so, then processing continues with INQUIRY 506. However, if the input is not a latch or primary input, then Current is pushed onto a stack, and Current is set to an address of the identified input, STEP 514.

Thereafter, a determination is made as to whether the obtained input has already been processed, INQUIRY 516. For example, a determination is made as to whether a latch id (e.g., Current.Latch-Id) has already been assigned to the input. If the input has not already been processed, then Current.Latch-Id (e.g., 300.Latch-Id) is set equal to Orig.Latch-Id (e.g., 200.Latch-Id), which in this example is one, STEP 518. Processing then continues with INQUIRY 506.

However, if the input has been processed, then it indicates that the current latch or primary output intersects with another latch or primary output. Thus, Orig.Latch-Id, Current.Latch-Id (e.g., 1,2) is added to an intersect list, STEP 520. The intersect list includes one or more tuples, and each tuple has a latch id (i.e., Orig.Latch-Id) and an intersect id (i.e., Current.Latch-Id). Processing then continues with INQUIRY 506.

At INQUIRY 506, when all the data inputs for Current have been processed, then a determination is made as to whether Current is equal to Origin, INQUIRY 522. If Current is not equal to Origin, then Current is set equal to the id popped off of the stack, STEP 524, and processing continues with INQUIRY 506. However, if Current is equal to Origin, then a cone of logic has been completed. The cone of logic includes the latch and any combinatorial logic associated therewith (e.g., LATCH A and combinatorial logic: Net 1, Net 2, Net 3).

Thereafter, a further determination is made as to whether all of the latch and primary outputs have been processed, INQUIRY 526. If not, then processing continues with STEP 504, in which another latch or primary output is selected from the output list. Further, Current is set equal to the selected output, Origin is set equal to Current, and Orig.Latch-Id is incremented by, for instance, one. Otherwise, processing is complete, and the resultant output is a plurality of cones of logic.

Subsequent to obtaining the cones of logic, the cones of logic are combined into a plurality of primary partitions. One embodiment of the logic associated with combining the cones of logic into primary partitions is described with reference to FIG. 8.

Initially, an intersect group is selected, STEP 800. An intersect group includes one or more entries from the intersect list that have the same latch id. For example, assume that a chip has ten latches (latch 1-latch 10). Further, assume that STEP 520 of FIG. 5 produced the following intersect list for that chip:

| Latch Id | Intersect Id |
|----------|--------------|
| 2 | 1 |
| 5 | 4 |
| 7 | 6 |
| 8 | 2 |
| 8 | 7 |
| 10 | 1 |
| 10 | 9 |

Then, a group would include 2,1; another group would include 5,4; . . . ; a further group would include 8,2 and 8,7; etc. Thus, one of the groups is selected.

Subsequent to selecting the intersect group, a determination is made as to whether there is more than one entry in the selected group (i.e., whether the group includes multiple entries with the same latch id), INQUIRY 802. If the group only has one entry, then a rule is produced for that group, STEP 803. For example, the first group (e.g., 2,1) only has one entry. Thus, the following rule is produced 2→1. If, however, there is more than one entry, INQUIRY 802, then a reduction process is performed to obtain a set of one or more primary intersections. In this example, the reduction process looks for the lowest intersect id of the group, STEP 804, and that lowest id is kept as the rule, STEP 806. For instance, in the above list, Latch Id 8 intersects with Latch Ids 2 and 7. Thus, the lowest intersect id is 2, and the rule that is kept is 8 intersects with 2 (e.g., 8→2).

Additionally, other rules are generated, in which other intersections indicated by the group also point to the lowest intersect id, STEP 808. For example, since Latch Id 8 also intersects with Latch Id 7, another rule is generated indicating that Latch Id 7 intersects with Latch Id 2.

After processing a group, either with one or more entries, a determination is made as to whether there are more groups in the intersect list, INQUIRY 809. If so, then processing continues with STEP 800. However, if all of the groups have been processed, then a set of rules has been produced for the intersect list. In this example, the set of rules include:

| Rules |
|-------|
| 2→1 |
| 5→4 |
| 7→6 |
| 8→2 |
| 7→2 |
| 10→1 |
| 9→1. |

After generating the rules, the rules are sorted, STEP 810. In one example, the rules are sorted in order of latch id, and secondarily, in order of intersecting id, when there are multiple latch ids of the same value. Thus, for the above example, the rules are sorted, as follows:

| Rules |
|-------|
| 2→1 |
| 5→4 |
| 7→2 |
| 7→6 |
| 8→2 |
| 9→1 |
| 10→1. |

Next, a check is made for duplicate rules, STEP 812. That is, a check is made as to whether there are multiple rules for a particular latch id. For instance, in the above scenario, there are two (2) rules for Latch Id 7. Thus, there is a set of multiple entries, in which each entry of the set has the same latch id.

If duplicates are found, INQUIRY 814, then processing continues with STEP 815 in order to remove the duplicates. In one example, the duplicates are removed by performing the following steps for each set of multiples:

Eliminating all entries of the set but one. The one entry kept, in this example, is the one with the lowest intersecting id (e.g., 7→2).

Then, the removed entries are converted by taking the intersecting ids of the removed entries, providing them as latch ids and assigning the intersecting id of the remaining entry of the set to the new latch ids. Thus, in the example, 7→6 is converted by taking the 6 of 7→6 for a latch id and assigning the 2 to produce 6→2.

In one embodiment, STEPS 810, 812, 814 and 815 are repeated until no duplicates are found, since new rules may produce duplicates for lower numbered latch ids.

Once the duplicates are removed, the rules are as follows:

| Latch id | | Intersect id |
|----------|---|--------------|
| 2 | → | 1 |
| 5 | → | 4 |
| 6 | → | 2 |
| 7 | → | 2 |
| 8 | → | 2 |
| 9 | → | 1 |
| 10 | → | 1. |

After converting the duplicates or if no duplicates were found, then a basic set of reduction rules is provided, which is used to generate the primary partitions. This basic set of rules is used to reduce the rules to a primary set, in which there are no intersect ids as latch ids. Thus, if necessary, at least one rule is applied to the other rules until the left and right sides are disjoint, STEP 816. For example, taking the first rule 2→1, each 2 on the right side is changed to a 1, which produces:

| Rules |
|---|
| 2→1 |
| 5→4 |
| 6→1 |
| 7→1 |
| 8→1 |
| 9→1 |
| 10→1. |

Subsequent to applying a rule, a determination is made as to whether an intersection of the left and right produces a result of zero, INQUIRY 818. Since, in this example, the left and right sides are disjoint, then no other rules need to be applied. Thus, the final conversion rules may be applied, STEP 820. However, if the intersection did not produce a zero value, then processing would continue at STEP 816.

In applying the final conversion rules, each latch of the chip is assigned a rule. For instance, in the above scenario, there are ten latches and each latch is assigned a rule. For example, latch 1 had no conversion, so it is assigned 1, latch 2 is converted to 1, etc., producing the following:

| Latch | Assignment |
|---|---|
| 1 | 1 |
| 2 | 1 |
| 3 | 3 |
| 4 | 3 |
| 5 | 4 |
| 6 | 4 |
| 7 | 1 |
| 8 | 1 |
| 9 | 1 |
| 10 | 1 |

Thus, there are three (3) unique assignments (e.g., 1, 3 and 4), which represent three (3) primary partitions, STEP 822. Each primary partition is assigned, in this example, the value of the lowest latch of the partition (e.g., 1, 3, 4).

The partitioning of a chip into logic cones, and then, combining the logic cones into primary partitions is also described in a co-filed U.S. patent application entitled "PARTITIONING A MODEL INTO A PLURALITY OF INDEPENDENT PARTITIONS TO BE PROCESSED WITHIN A DISTRIBUTED ENVIRONMENT", Rich et al., Ser. No. 10/125,217, which is hereby incorporated herein by reference in its entirety.

Subsequent to obtaining the primary partitions, the clock and maintenance logic associated with the primary partitions is determined. One embodiment of the logic associated with partitioning the clock and maintenance logic is described with reference to FIGS. 9a-9c. Further, one embodiment of a sample portion of clock and maintenance logic to be partitioned is depicted in FIG. 10.

Figure 9A:
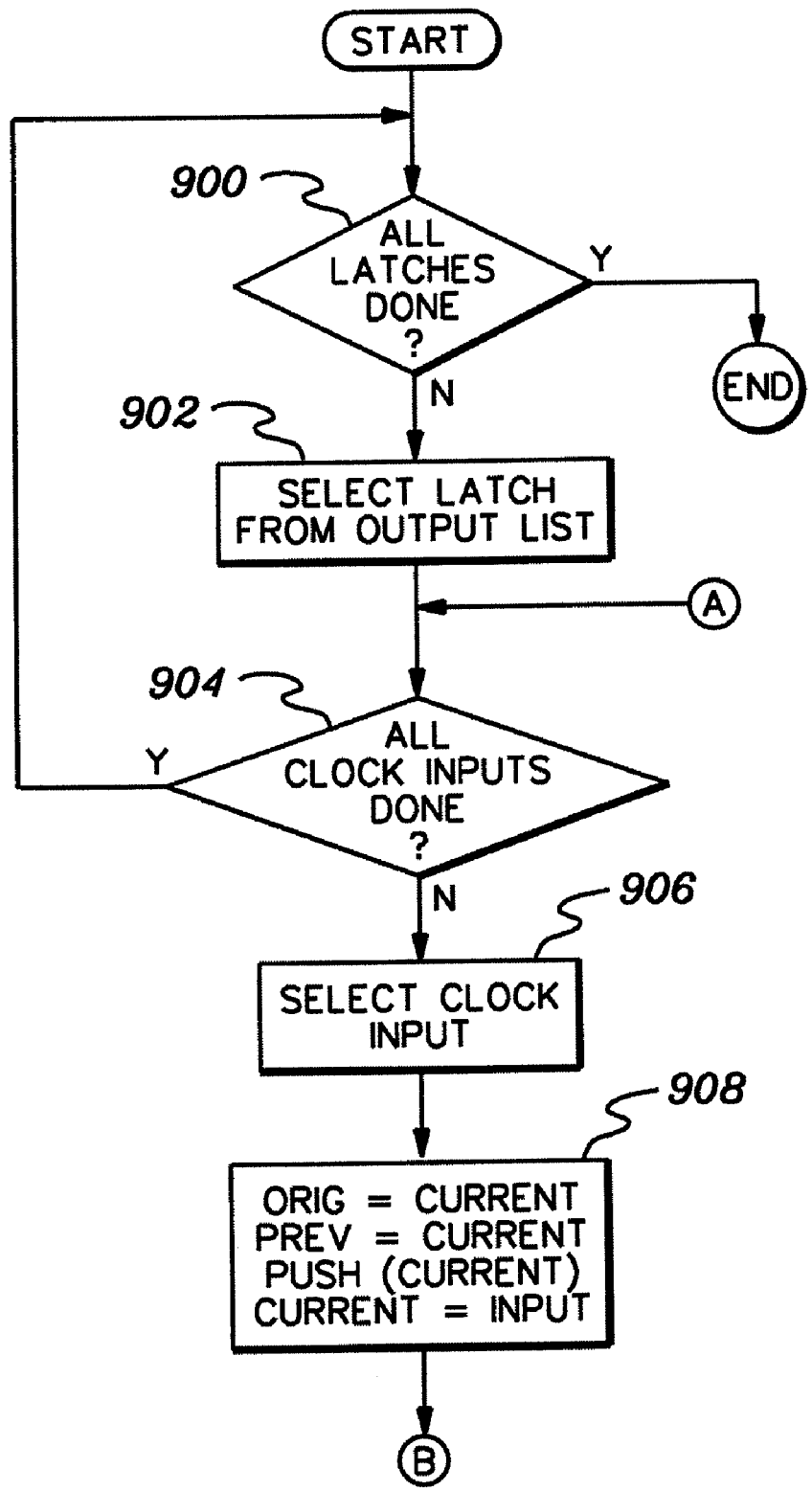
FIGS. 9a-9c depict one embodiment of the logic associated with partitioning the clock and maintenance logic of a model, in accordance with an aspect of the present invention.
Figure 9B:
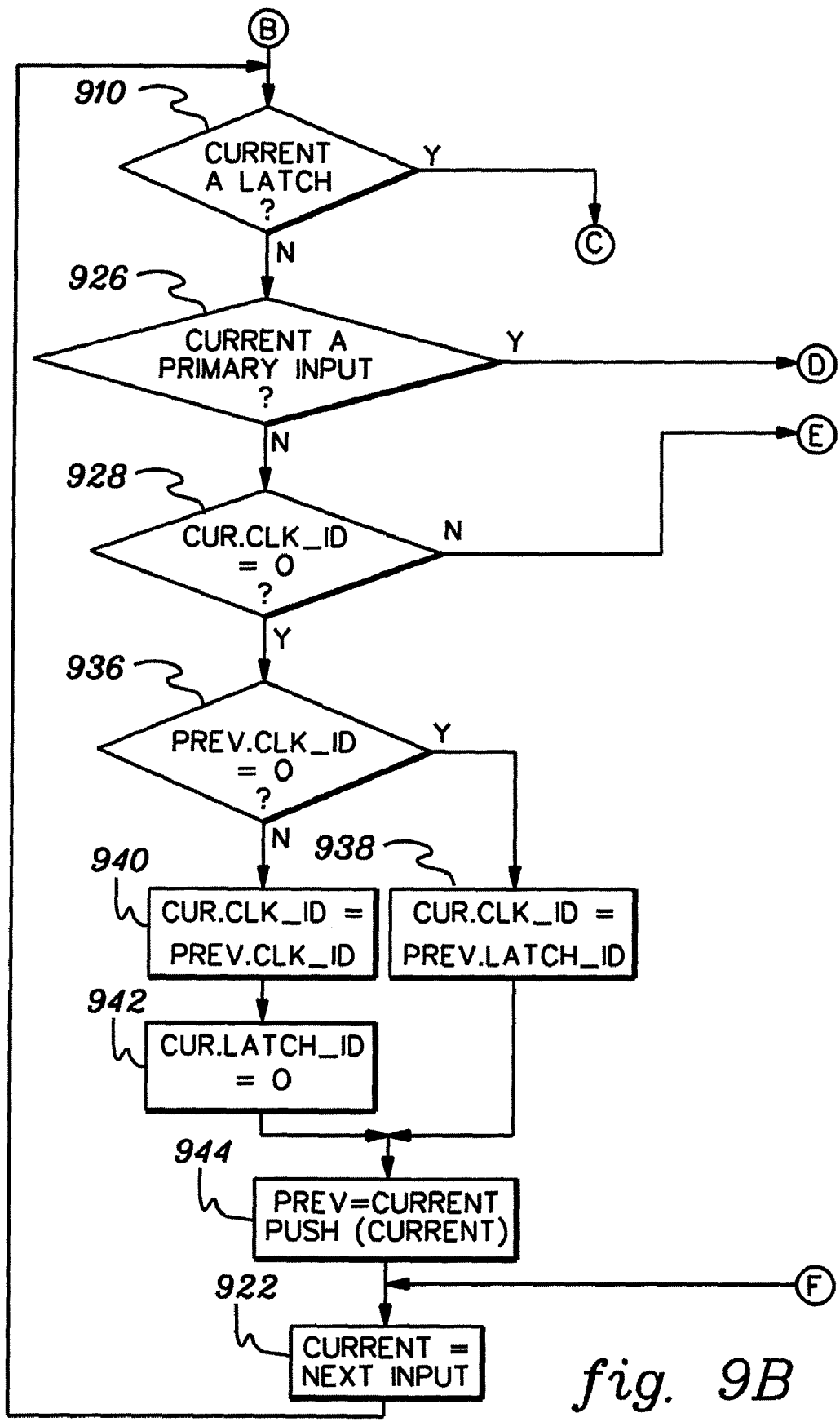
Figure 9C:
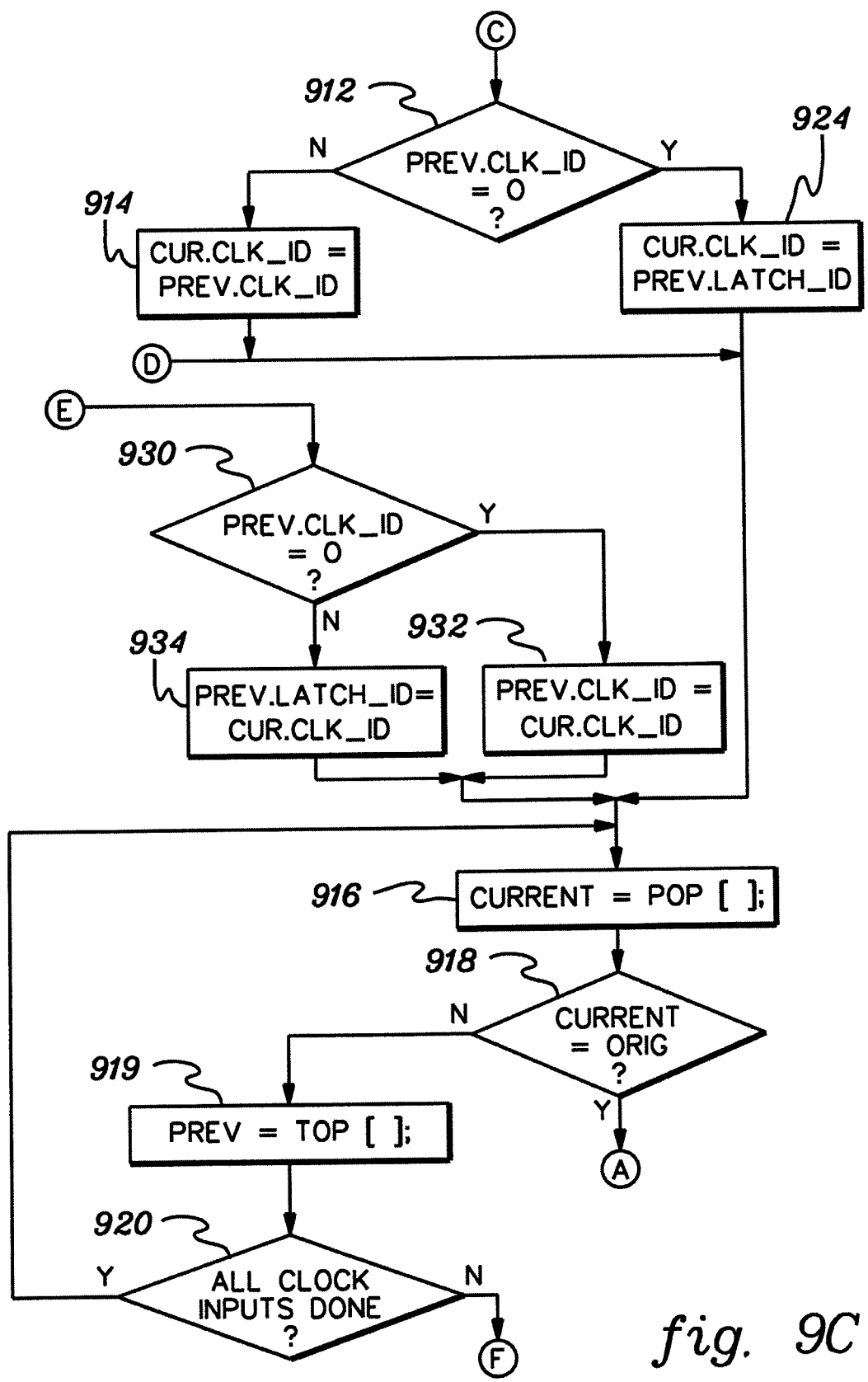
Figure 10:
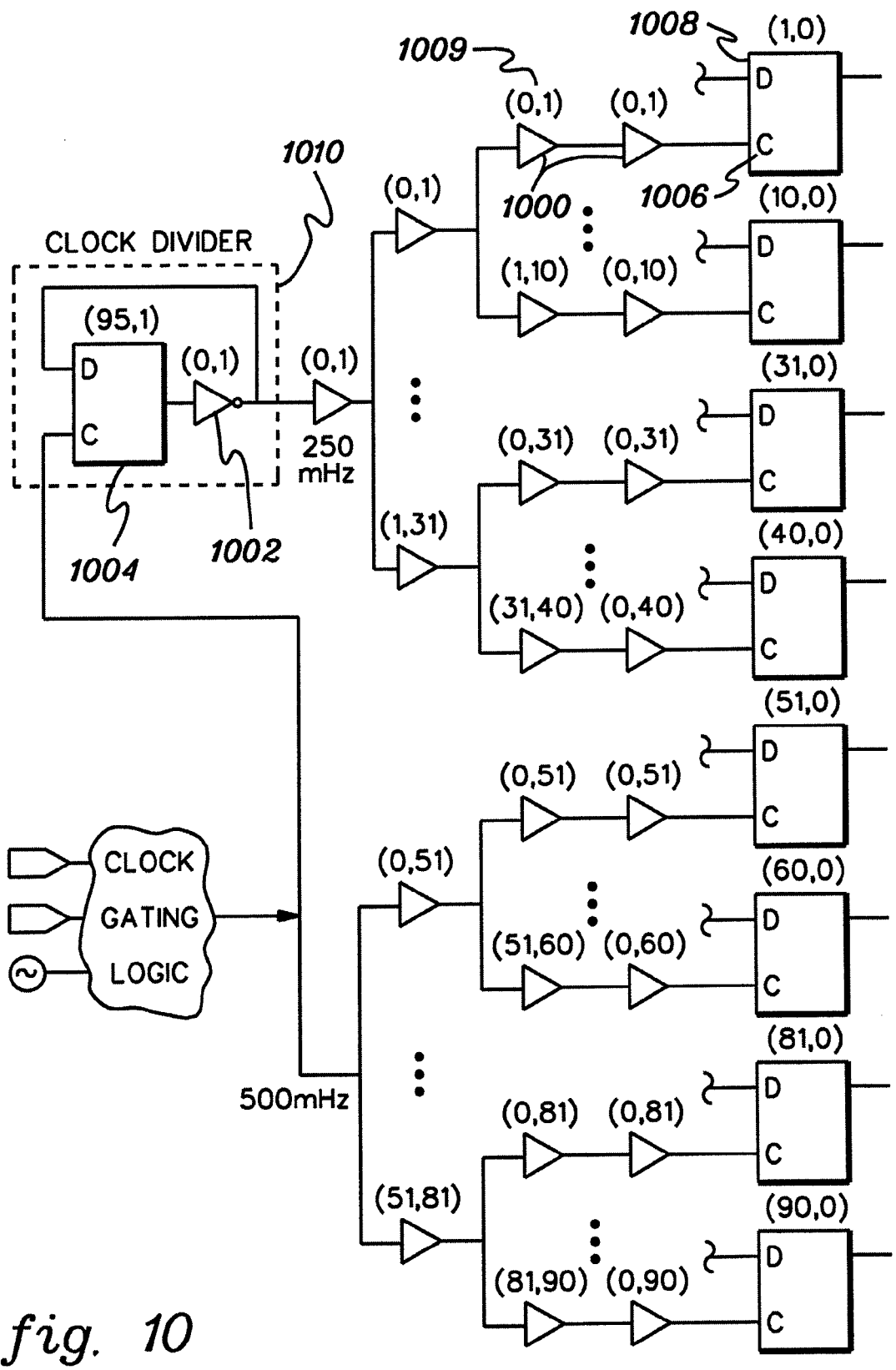
FIG. 10 is a pictorial illustration of clock and maintenance logic for a sample portion of a model, in accordance with an aspect of the present invention.

As depicted in FIG. 10, the clock and maintenance logic includes a plurality of components, such as, for instance, one or more buffers 1000, one or more inverters 1002, and/or one or more latches 1004, which are input to one or more clock pins 1006 of one or more latches 1008. Other components may also exist. In one embodiment, each component of the clock and maintenance logic has a tuple 1009 associated therewith. The tuple includes a LATCH_ID, CLK_ID pair determined from the partitioning processing. For instance, the LATCH_IDs are mostly provided from performing the logic of FIG. 5, although some of the values may be overridden by the processing of FIGS. 9a-9c; and the CLK_IDs are provided from performing the logic of FIGS. 9a-9c.

Referring to FIG. 9a, initially, a determination is made as to whether all of the latches of the chip have been processed, INQUIRY 900. If all of the latches have not been processed, then a latch is selected from the output list previously provided, STEP 902. Thereafter, a determination is made as to whether all of the clock inputs of the selected latch have been processed, INQUIRY 904. If all of the clock inputs have been processed, then processing continues with INQUIRY 900. However, if all of the clock inputs have not been processed, then a clock input is selected, STEP 906. Additionally, a variable referred to as Orig is set equal to another variable referred to as Current, which initially represents the latch being processed; a variable Prev is set equal to Current; Current is pushed onto a stack; and Current is set equal to a variable referred to as Input, which initially represents the clock input being processed, STEP 908.

Thereafter, processing continues with FIG. 9b, in which a determination is made as to whether Current is a latch, INQUIRY 910. Should Current be a latch (such as with clock divider 1010 of FIG. 10), then a further determination is made as to whether PREV.CLK_ID is equal to zero, INQUIRY 912 (FIG. 9c). If PREV.CLK_ID is not equal to zero, then CUR.CLK_ID is set equal to PREV.CLK_ID, STEP 914. Otherwise, if PREV.CLK_ID is equal to zero indicating a latch to latch connection, then CUR.CLK_ID is set equal to PREV.LATCH_ID, STEP 924.

Subsequent to setting CUR.CLK_ID, the stack is popped to obtain the previous Current, STEP 916. Thereafter, a determination is made as to whether Current is equal to Orig, INQUIRY 918. If Current is equal to Orig, then processing continues with INQUIRY 904 (FIG. 9a). However, if Current is not equal to Orig, then Prev is set equal to data taken from the top of the stack (without popping the stack), STEP 919.

Next, a determination is made as to whether all of the clock inputs have been processed, INQUIRY 920. If all of the clock inputs have not been processed, then Current is set equal to the next Input, STEP 922 (FIG. 9b), and processing continues with INQUIRY 910. Otherwise, processing continues with STEP 916 (FIG. 9c).

Returning to INQUIRY 910 (FIG. 9b), if Current is not a latch, then a further determination is made as to whether Current is a primary input, INQUIRY 926. If Current is a primary input, then processing continues with STEP 916 (FIG. 9c), as described above. However, if Current is not a primary input, then a further determination is made as to whether CUR.CLK_ID is equal to zero, INQUIRY 928 (FIG. 9b). If CUR.CLK_ID is not equal to zero, which implies that this clock logic is shared with other functional latches, then a further determination is made as to whether PREV.CLK_ID is equal to zero, INQUIRY 930 (FIG. 9c). Should PREV.CLK_ID be equal to zero, typically indicating a latch, then PREV.CLK_ID is set equal to CUR.CLK_ID, STEP 932. Otherwise, if PREV.CLK_ID is not equal to zero, indicating that one buffer is driving multiple latches, then PREV.LATCH_ID is set equal to CUR.CLK_ID, STEP 934. After setting either PREV.LATCH_ID or PREV.CLK_ID, processing continues with STEP 916.

Returning to INQUIRY 928 (FIG. 9b), if CUR.CLK_ID is equal to zero, then combinatorial clock logic associated with the latch is to be identified. Thus, a further determination is made as to whether PREV.CLK_ID is equal to zero, INQUIRY 936. If PREV.CLK_ID is equal to zero, then CUR. CLK_ID is set equal to PREV.LATCH_ID, STEP 938. Otherwise, CUR.CLK_ID is set equal PREV.CLK_ID, STEP 940, and CUR.LATCH_ID is set equal to zero to override the data value provided during the partitioning of the functional logic, STEP 942.

After setting CUR.LATCH_ID and/or CUR.CLK_ID, Prev is set equal to Current, and Current is pushed onto the stack, STEP 944. Further, Current is set equal to the next Input, STEP 922, and processing continues with INQUIRY 910.

As described herein, the partitioning of the chip produces one or more LATCH_ID, CLK_ID tuples for the chip. These tuples can be categorized into four types, which are summarized in the table below:

| TYPE | LATCH_ID ≠ 0 | CLK_ID ≠ 0 | PARTITION CHARACTERISTIC |
|---|---|---|---|
| 1 | No | No | Partitionable Independent Logic |
| 2 | Yes | No | Partition Specific Functional Logic |
| 3 | No | Yes | Partition Specific Clock/Maintenance Logic |
| 4 | Yes | Yes | Shared Clock/Maintenance |

The categorizing of the tuples into the various types is useful in the mapping of the clock and maintenance logic to the target processors, as described in further detail below.

Subsequent to determining the clock/maintenance logic associated with the primary partitions, the primary partitions are grouped based on clock domains. For instance, if a chip has three clock domains (e.g., C1 at 500 MHz, C2 at 250 MHz and C3 at 125 MHz), then three groups of partitions are provided. Likewise, if there are five clock domains, then five groups of partitions are provided, etc. Each group of partitions includes one or more primary partitions having the same clock domain.

Figure 11:
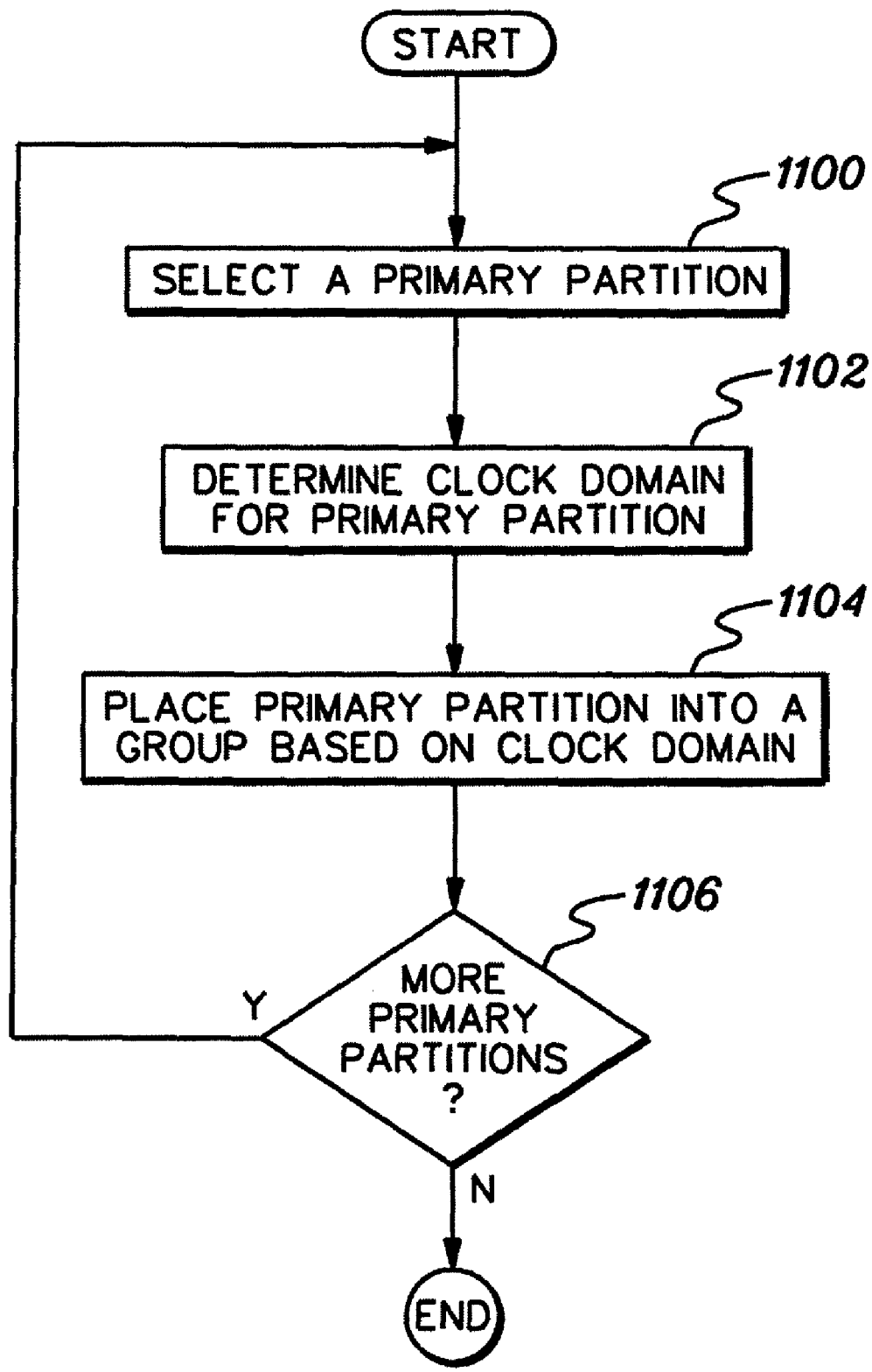
FIG. 11 depicts one embodiment of the logic associated with grouping the plurality of primary partitions of FIG. 8 into one or more groups of partitions, in accordance with an aspect of the present invention.

One embodiment of the logic associated with grouping the primary partitions based on clock domains is described with reference to FIG. 11. Initially, a primary partition is selected, STEP 1100. Thereafter, the clock domain for that primary partition is determined, STEP 1102. In one example, this determination is made by associating a set of name prefixes to each clock domain, such that any logic netname which has a name prefix in the set will be associated with that clock domain. The frequency of the clock domain will be another attribute supplied with the prefix sets.

Next, the primary partition is placed into a group based on its clock domain, STEP 1104. If this is the first primary partition for that clock domain, then this primary partition starts a new group. Otherwise, the primary partition is placed in a group of the same clock domain.

Subsequently, a determination is made as to whether there are more primary partitions to be grouped, INQUIRY 1106. If there are more primary partitions, then processing continues with STEP 1100. Otherwise, the grouping of primary partitions is complete.

Figure 12A:
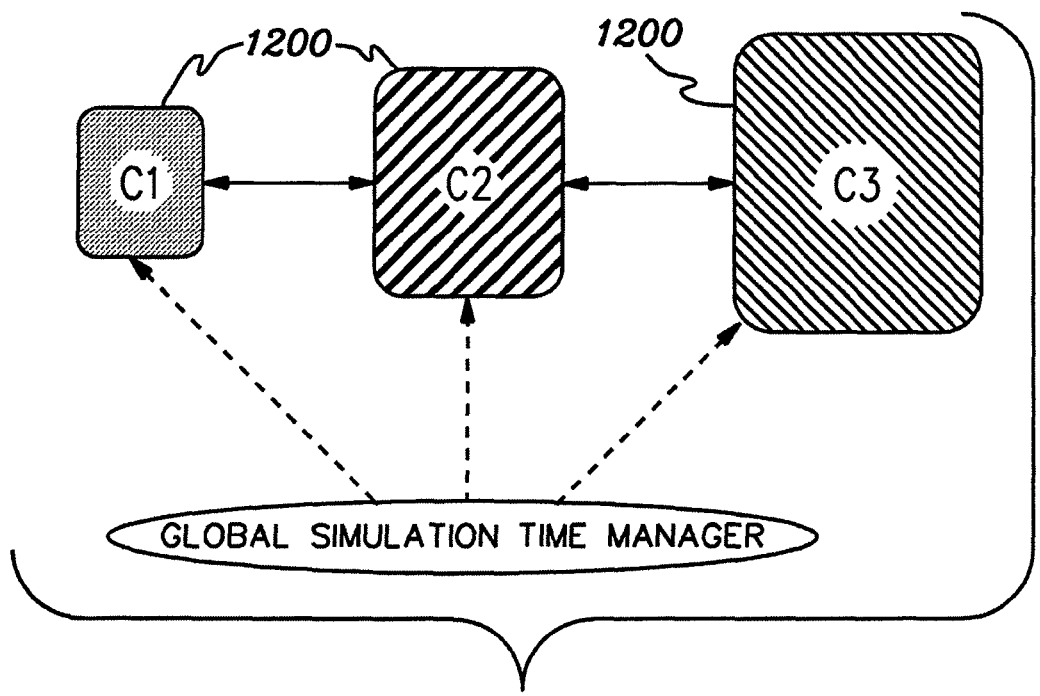
FIGS. 12a-12b depict examples of groups of primary partitions grouped based on clock domains, in accordance with an aspect of the present invention.
Figure 12B:
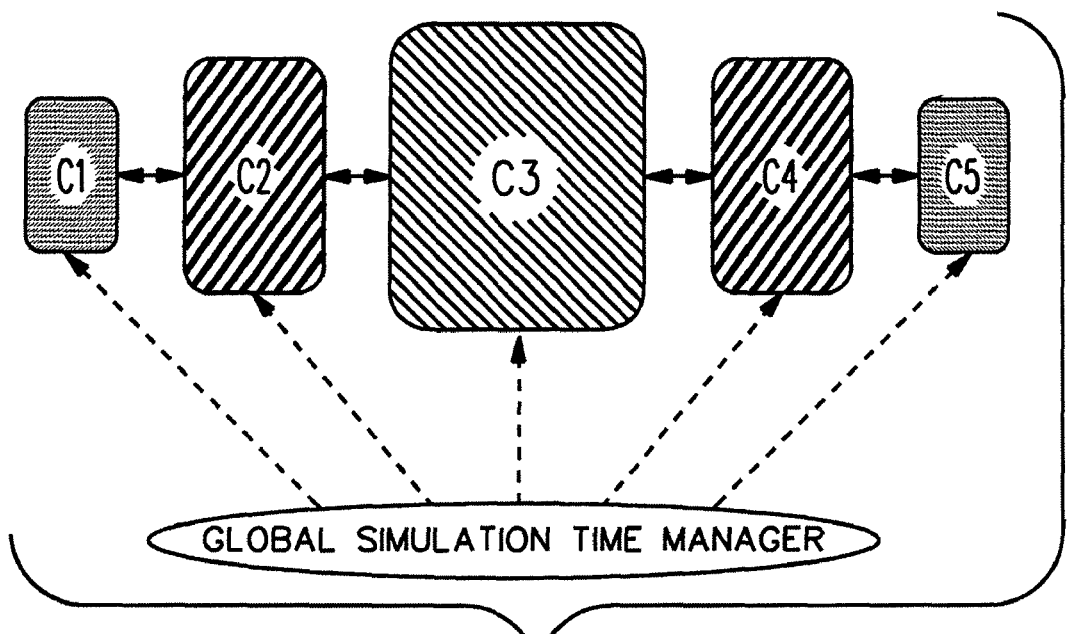

The grouping of partitions based on clock domains is illustrated in FIGS. 12*a*-12*b*. In particular, FIG. 12*a* depicts three groups of partitions 1200 corresponding to three clock domains, C1, C2 and C3, respectively. Each of the domains has one or more partitions associated therewith. As shown by its size, C3 includes most of the logic of the chip. Another example is depicted in FIG. 12*b*, in which a chip has five clock domains, C1-C5. Many other examples are possible.

Subsequent to grouping the primary partitions based on clock domains, one or more groups of partitions are adjusted to facilitate communication between partitions on different processors. As one example, one or more groups of partitions are adjusted to eliminate asynchronous clock boundaries across the network. This adjustment is based on a selected policy. Although there can be many different policies for the adjustment, two policies are described herein.

Figure 13A:
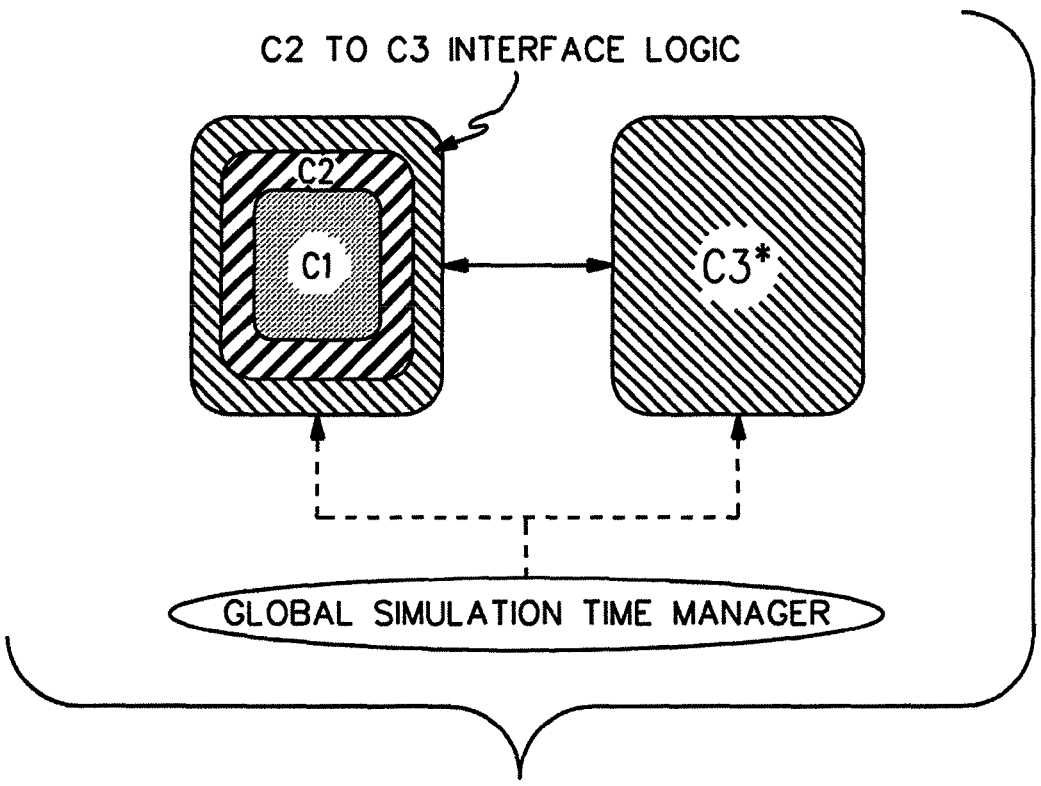
FIGS. 13a-13b illustrate examples of groups of partitions being combined, in accordance with an aspect of the present invention.
Figure 13B:
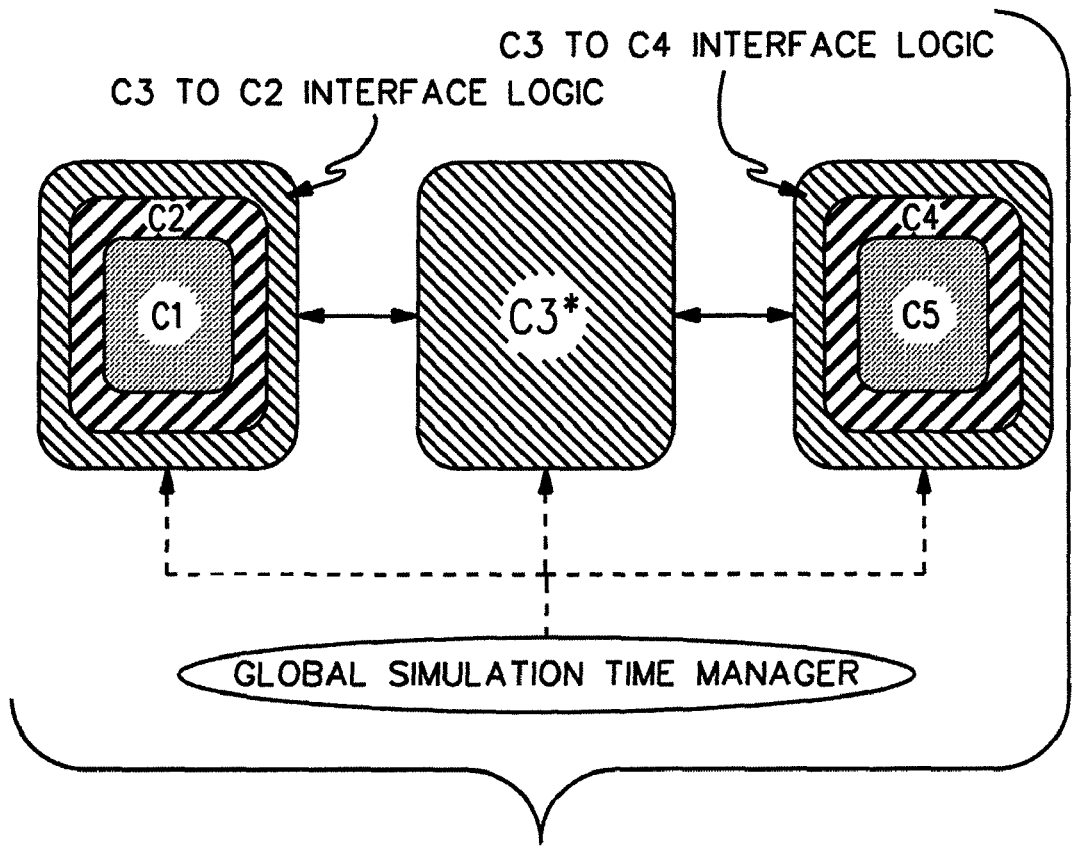

As one example, one policy includes reducing the number of clock domain boundaries. With this policy, one or more of the clock domains are combined with one or more other clock domains, as shown in FIGS. 13*a*-13*b*. With reference to FIG. 13*a*, it is shown that domains C2 and C1 (of FIG. 12*a*) are combined. Then, a thin layer of C3 is added to the combination, as explained further below. (Thus, C3 is a little smaller, as indicated by the *.) Similarly, in FIG. 13*b*, it is shown that C1 and C2 (of FIG. 12*b*) are combined into one combination, and C4 and C5 are combined into another combination. Each combination also has a thin layer of C3. With this policy, the global simulation time manager has fewer clocks (e.g., one in these examples) to globally manage.

Another policy includes, for example, eliminating the asynchronous clock boundaries across the network by adding interfaces to one or more of the partition groups, such that communication across domains is synchronous. For example, with reference to FIG. 14, it is shown that a C2 interface is added to C1, such that C2 communicates with C2 across the network.

Figure 14:
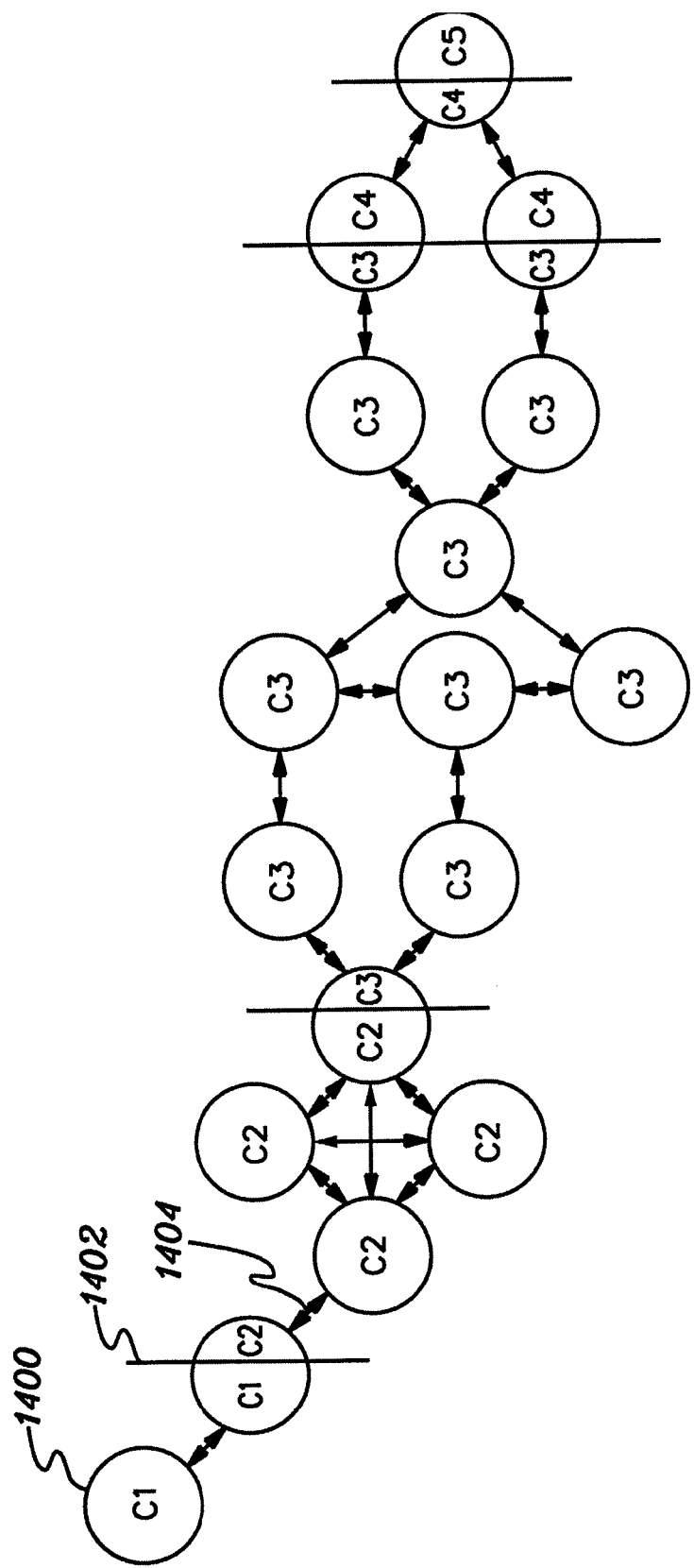
FIG. 14 illustrates one example of groups of partitions receiving interfaces from other partitions, in accordance with an aspect of the present invention.

In particular, FIG. 14 depicts 17 processors 1400, each processing one or more partitions of a particular clock domain. Each vertical line 1402 represents a boundary in which partitions were initially to communicate across the network. Since one of the partitions in the C1 domain executing on one processor was to communicate across the network with one of the partitions in the C2 domain executing on another processor, as shown by boundary 1402, an interface of C2 is moved to C1, such that asynchronous communication across clock boundaries C1 and C2 is performed within a processor, and communication across the network 1404 is between synchronous C2 clocks.

Similarly, an interface of C3 is moved to C2; an interface of C3 is moved to C4; and an interface of C4 is moved to C5. Thus, even though clock domains have not been combined, communication over the network across asynchronous clock boundaries has been eliminated.

Figure 15:
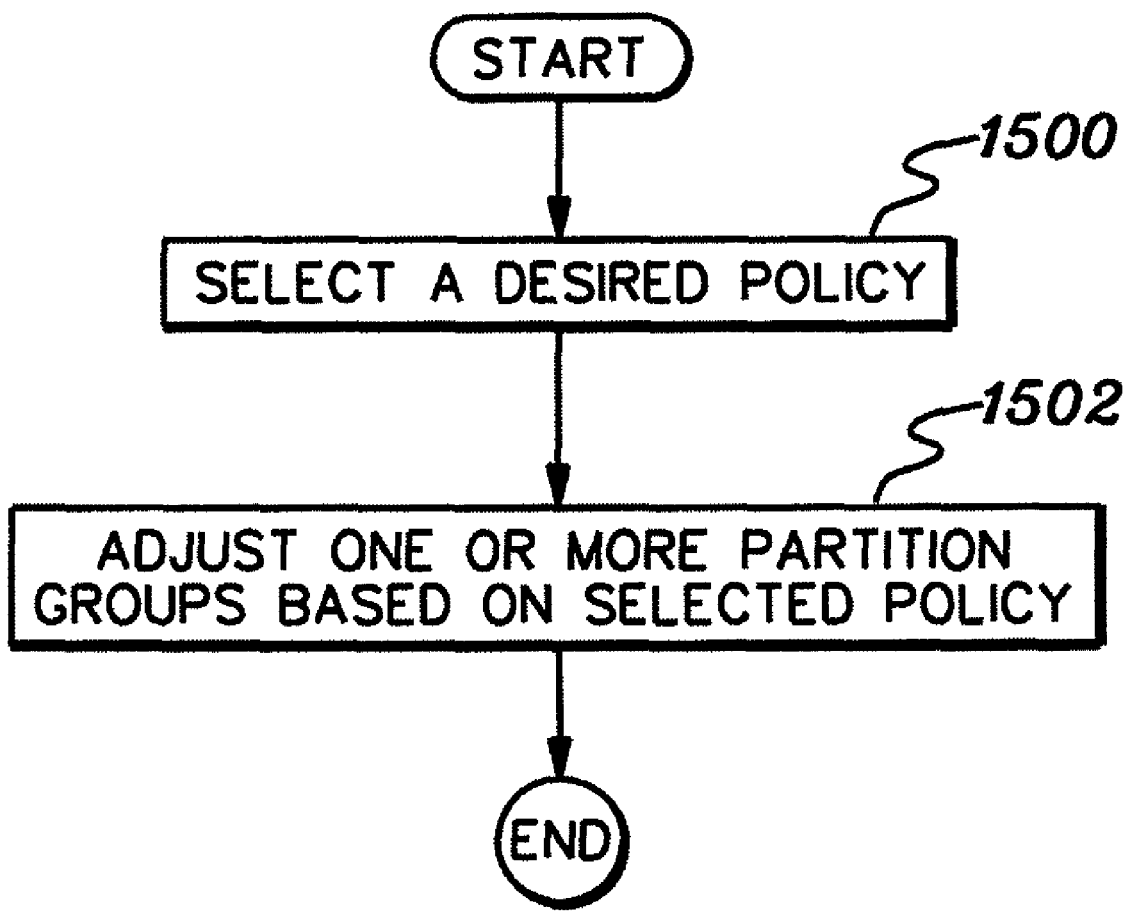
FIG. 15 depicts one embodiment of an overview of the logic associated with adjusting one or more groups of partitions, in accordance with an aspect of the present invention.

One embodiment of an overview of the logic associated with adjusting one or more groups of partitions is described with reference to FIG. 15. Initially, the desired policy is selected, STEP 1500, and then, one or more partition groups are adjusted, based on the selected policy, STEP 1502. This adjusting is described in more detail with reference to FIGS. 16*a*-16*c*.

Figure 16A:
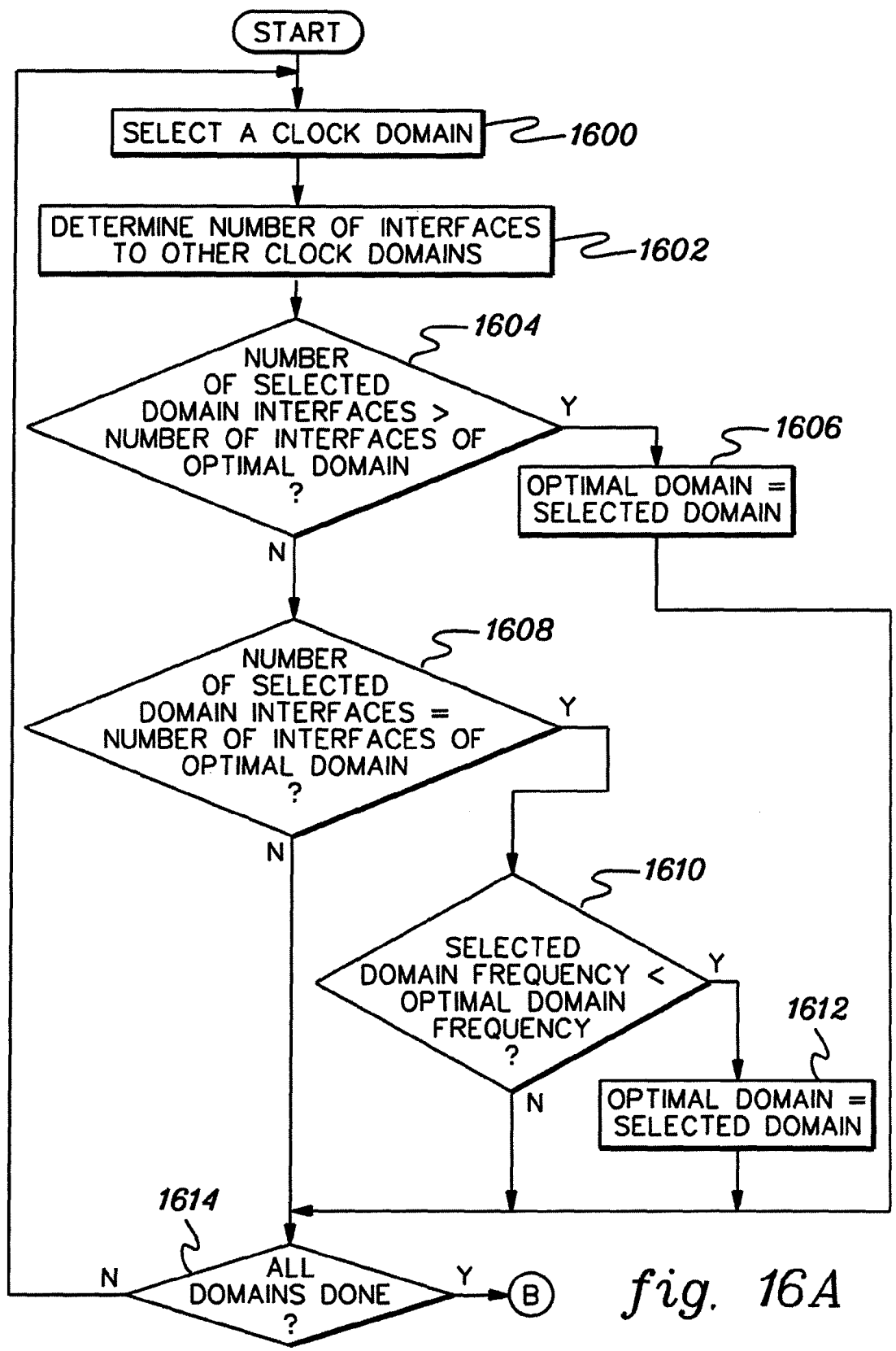
FIGS. 16a-16b depict one embodiment of the logic associated with adjusting one or more groups of primary partitions, in accordance with an aspect of the present invention.
Figure 16B:
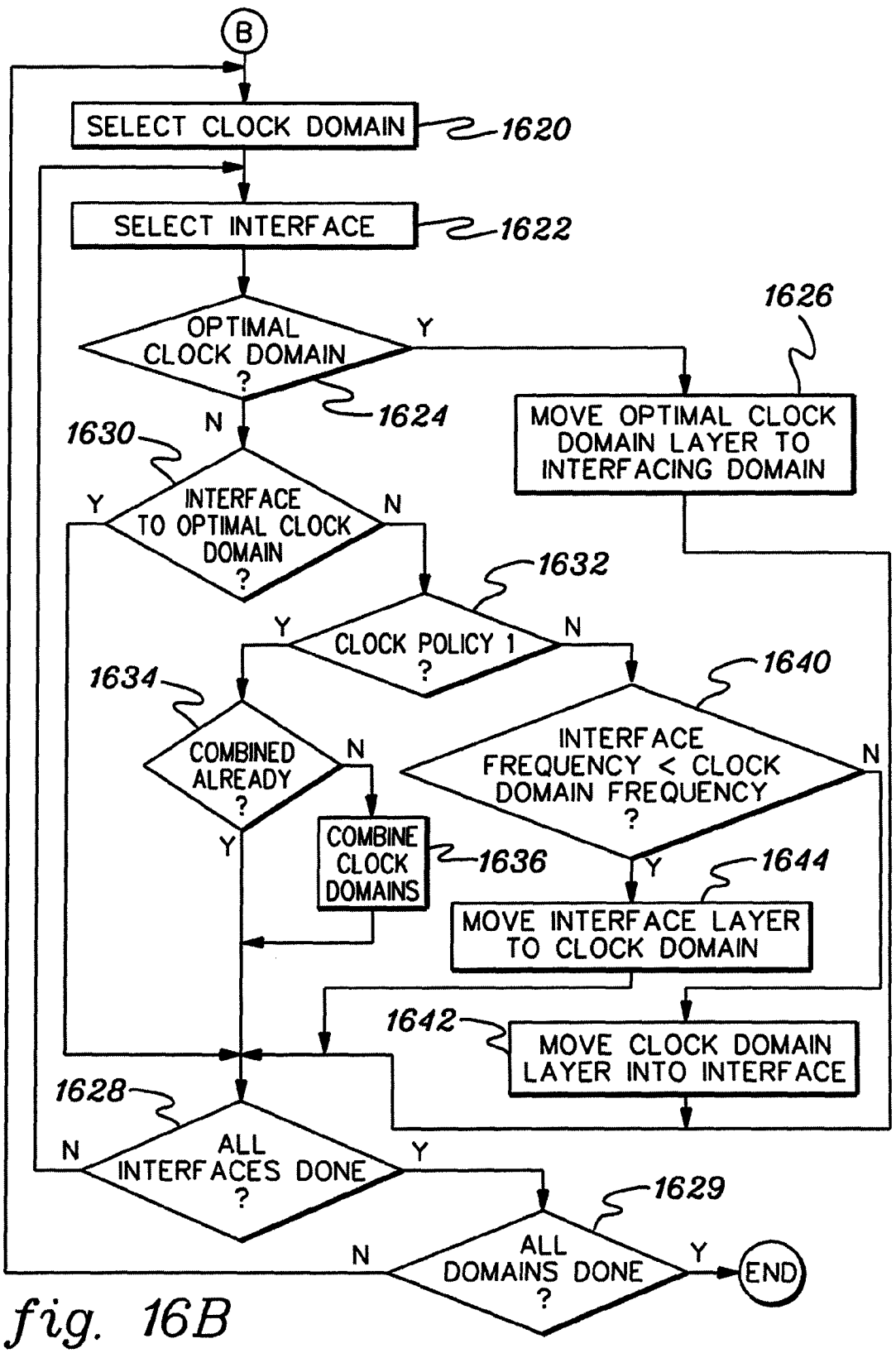

In particular, FIGS. 16*a*-16*b* depict one embodiment of the logic associated with the adjusting for both policies described herein; and FIG. 16*c* is used in describing various examples associated with the logic. It will be understood that if only one of the policies is used, then some of the logic is not needed. It will be further understood that a portion or all of the logic may be different for other policies.

Referring to FIG. 16*a*, the optimal clock domain is determined from among a plurality of clock domains. Thus, initially a clock domain (e.g., Clock Domain 1 (FIG. 16*c*)) is selected, STEP 1600. Then, the number of interfaces to other clock domains is determined (e.g., 1 for Clock Domain 1—FIG. 16c), STEP 1602. In one example, this determination is made by determining which outputs of the domain are inputs to other domains.

Thereafter, an inquiry is made as to whether the number of interfaces determined is greater than the number of interfaces for an optimal domain (initialized to zero), INQUIRY 1604. If the number of interfaces determined is greater than the number of interfaces for the optimal domain, then the optimal domain is set equal to the selected domain, STEP 1606, and processing continues with INQUIRY 1614, as described below.

However, if the number of interfaces is determined to be less than or equal to the number of interfaces for the optimal domain, then a further determination is made as to whether the number of interfaces for the selected domain is equal to the number of interfaces for the optimal domain, INQUIRY 1608. If so, then another inquiry is made as to whether the frequency of the selected domain is less than the frequency of the optimal domain, INQUIRY 1610. Should the selected domain frequency be less than the optimal domain frequency, then the optimal domain is set equal to the selected domain, STEP 1612. Thereafter, or if the selected domain frequency is greater than or equal to the optimal domain frequency, then processing continues with INQUIRY 1614. Similarly, if the number of selected domain interfaces is not equal to the number of interfaces of the optimal domain, then processing continues with INQUIRY 1614.

At INQUIRY 1614, a determination is made as to whether all of the domains have been processed. If not, then processing continues with STEP 1600, in which another clock domain is selected. Otherwise, processing continues with STEP 1620 of FIG. 16b.

Referring to FIG. 16b, initially, a clock domain is selected, STEP 1620, as well as an interface of the selected domain, STEP 1622. Thereafter, a determination is made as to whether the selected domain is the optimal clock domain, INQUIRY 1624. If it is the optimal clock domain, then a layer of the optimal clock domain is moved to the domain of the selected interface, STEP 1626. In one example, this includes moving an interfacing primary partition (i.e., a latch which connects to logic across the network) from the optimal domain to the domain of the interface.

Next, a determination is made as to whether all of the interfaces of the selected clock domain have been processed, INQUIRY 1628. If all of the interfaces have not been processed, then another interface is selected, STEP 1622. Otherwise, a determination is made as to whether all of the domains have been processed, INQUIRY 1629. If not, then processing continues with STEP 1620. Once all of the domains have been processed, then the adjustment process is complete.

Returning to INQUIRY 1624, if the selected domain is not the optimal clock domain, then a further determination is made as to whether the chosen interface is an interface to the optimal clock domain, INQUIRY 1630. If it is an interface to the optimal clock domain, then processing continues with INQUIRY 1628. However, if it is not an interface to the optimal clock domain, then a further determination is made as to whether Clock Policy 1 (i.e., the combination policy) is in effect, INQUIRY 1632.

If Clock Policy 1 is the chosen policy, then a determination is made as to whether the selected clock domain and the clock domain of the chosen interface have already been combined, INQUIRY 1634. If not, then they are combined, STEP 1636. In one example, they are combined by placing all of the partitions of both domains in one group of partitions. Thereafter, or if they have already been combined, processing continues with INQUIRY 1628.

Returning to INQUIRY 1632, if Clock Policy 1 is not in effect, then a further inquiry is made as to whether the frequency of the domain of the selected interface is less than the frequency of the selected clock domain, INQUIRY 1640. If not, then a layer of the clock domain is moved to the domain of the interface, assuming such a move has not already been performed, STEP 1642, and processing continues with INQUIRY 1628. Otherwise, a layer of the interface domain is moved to the selected clock domain, again, assuming such a move has not already been performed, STEP 1644, and processing continues at INQUIRY 1628.

Described above is a technique for adjusting the clock domains based on the selected policy. Two examples are provided herein, one for Clock Policy 1 and another for Clock Policy 2 using the above technique. The examples are described with reference to FIGS. 16a-16c.

In the first example, Clock Policy 1 is in effect, and a goal of this policy is to reduce the number of clock domains to a minimum number. Thus, the logic of FIGS. 16a-16b is processed.

Referring to FIG. 16a, initially a determination is made as to which of the clock domains depicted in FIG. 16c is the optimal clock domain. Thus, Clock Domain 1 is selected, and it is determined that the number of interfaces to other clock domains for Clock Domain 1 is one. Since this is the first domain being processed, the optimal domain is set equal to Clock Domain 1. Further, since the optimal domain is equal to the selected domain, the number of interfaces of both are equal, and therefore, a determination is made as to whether the selected domain frequency is less than the optimal domain frequency. Since they are one in the same, processing continues with Clock Domain 2.

With Clock Domain 2, it is determined that it has two clock domain interfaces, and since that number is greater than the number of interfaces for the optimal domain, the optimal domain is now set equal to the selected domain. Processing then continues as described above, and Clock Domain 3 is selected next.

Once again, the number of interfaces to other clock domains is equal to 2 and thus, the number of interfaces of the selected domain (e.g., Clock Domain 3) is equal to the number of interfaces of the optimal domain (e.g., Clock Domain 2). Therefore, processing continues with determining whether the selected domain frequency (e.g., 125 MHz) is less than the optimal domain frequency (e.g., 250 MHz). In this example, since the frequency of the selected domain is less than the optimal domain frequency, the optimal domain is set equal to Clock Domain 3. Processing then continues as above, and the result is that Clock Domain 3 is the optimal clock domain, since it has the same number of clock domain interfaces as other clock domains, but a slower frequency.

Subsequent to determining the optimal clock domain, processing continues with FIG. 16b in which one or more clock domains are adjusted. With reference to FIG. 16b, Clock Domain 1 and Interface 2 are selected. Since Clock Domain 1 has not been determined to be the optimal clock domain, processing continues with a determination as to whether Interface 2 is an interface to the optimal clock domain (e.g., Clock Domain 3). Since Interface 2 is not an interface to the optimal clock domain, and this is Clock Policy 1, a determination is made as to whether Clock Domains 1 and 2 have been combined. Since they have not been combined, they are combined, and processing continues with determining whether there are any more interfaces for Clock Domain 1.

Since there are no more interfaces, another Clock Domain is selected (e.g., Clock Domain 2). Further, an interface of that clock domain (e.g., Interface 3) is selected.

Since Clock Domain 2 is not the optimal clock domain, but Interface 3 is an interface to the optimal clock domain, then processing of this interface is complete. However, since Clock Domain 2 has another interface (e.g., Interface 1), that interface is selected. Since Clock Domain 2 is not the optimal clock domain and Interface 1 is not an interface to the optimal clock domain, processing continues with determining whether Clock Policy 1 is in effect. Since this policy is in effect, an inquiry is made as to whether the selected clock domain (e.g., Clock Domain 2) has been combined with the clock domain of the selected interface (e.g., 1). Since those two domains have been combined, processing continues with selecting the next clock domain. In this example, the next clock domain is the optimal clock domain (e.g., Clock Domain 3), and therefore, the optimal clock domain layer is moved to the interfacing domain (e.g., Clock Domain 2). Thereafter, since there are further interfaces for Clock Domain 3, the next interface is selected. Again, since this is the optimal clock domain, the optimal clock domain layer is moved to the interfacing domain (e.g., Clock Domain 4).

Next, Clock Domain 4 and Interface 3 are selected. Since Clock Domain 4 is not the optimal clock domain, but Interface 3 is an interface to the optimal clock domain, processing continues with selecting the next interface (e.g., Interface 5) for Clock Domain 4. Again, since Clock Domain 4 is not the optimal clock domain, Interface 5 is not an interface to the optimal clock domain, and this is Clock Policy 1, a determination is made as to whether Clock Domain 4 and Clock Domain 5 have been combined. Since they have not been combined, they are now combined, and that completes the processing for Clock Domain 4.

Thereafter, the processing for Clock Domain 5 and Interface 4 is performed. Since Interface 4 is not an interface to the optimal clock domain, and this is Clock Policy 1, processing continues with determining whether Domains 5 and 4 have been combined. Since they have been combined, processing is complete. The result of this processing is that Clock Domains 1 and 2 are combined into one group, Clock Domains 4 and 5 are combined into another group, and the interface layer for Clock Domain 3 is wrapped around both groups (see FIG. 13b).

Next, another example is provided in which the second policy is selected. With this policy, a greater number of processors is to be used, and thus, the domains are not reduced to a minimal number. However, asynchronous clock boundaries across a network are still avoided.

Initially, Clock Domain 1 and Interface 2 are selected. Since Clock Domain 2 is not an interface to the optimal clock domain and Clock Policy 2 is in effect, a determination is made as to whether the frequency of the interface (e.g., 250 MHz) is less than the frequency of the selected clock domain (e.g., 500 MHz). Since the frequency of the interface is less than the clock domain frequency, a layer of the interface (e.g., a partition) is moved into the clock domain. Thereafter, since there are no further interfaces for Clock Domain 1, processing continues for Clock Domain 2 and Interface 3.

Since Clock Domain 2 is not the optimal clock domain, but Interface 3 is an interface to the optimal clock domain, processing for that interface is complete. Thus, Interface 1 is selected. Again, since Clock Domain 2 is not the optimal clock domain and since Interface 1 is not an interface to the optimal clock domain, a determination as to the policy in effect is made. Since this is Clock Policy 2, and since the interface frequency (e.g., 500 MHz) is not less than the clock domain frequency (e.g., 250 MHz), a layer of the clock domain is moved into a layer of the interface, assuming this has not been done before. Since, in this case, it has already been done, a further move is not necessary.

Processing then continues with Clock Domain 3 and Interface 2. Since Clock Domain 3 is the optimal clock domain, the optimal clock domain layer is moved to Interface 2, and processing continues with Interface 4 of Clock Domain 3. Again, since Clock Domain 3 is the optimal clock domain, the layer of the clock domain is moved to Interface 4.

Next, processing continues with Clock Domain 4 and Interface 3. Since Interface 3 is an interface to the optimal clock domain, processing continues with Interface 5. However, since Clock Domain 4 is not the optimal clock domain, Interface 5 is not an interface to the optimal clock domain, and this is Clock Policy 2, the interface frequency (e.g., 750 MHz) is compared with the clock domain frequency (e.g., 200 MHz). Since the interface frequency is not less than the clock domain frequency, a layer of the clock domain is moved into the interface.

Next, processing continues with Clock Domain 5, Interface 4. Since, Clock Domain 5 is not the optimal clock domain, Interface 4 is not an interface of the optimal clock domain, Clock Policy 2 is in effect and since the interface frequency is less than the clock domain frequency, an interface layer is moved into the clock domain, if this has not already been done.

Thus, the outcome of the above logic for Policy 2 is that an interface for Clock Domain 2 is moved into Clock Domain 1; an interface of Clock Domain 3 is moved into Clock Domain 2; an interface of Clock Domain 3 is moved into Clock Domain 4; and an interface of Clock Domain 4 is moved into Clock Domain 5 (see FIG. 14).

Subsequent to adjusting the one or more groups of primary partitions, the primary partitions are assigned to an arbitrary set of processors. In one embodiment, the number of processors selected is independent of the partitioning; however, the adjusting policy selected may have some impact on how many processors are to be used. In other examples, the number of processors used is irrespective of the selected adjusting policy.

One embodiment of the logic associated with mapping the primary partitions to an arbitrarily chosen number of target processors is described with reference to FIG. 17a. In this example, the mapping policy is based on equality, in which each processor is assigned to a group of partitions in order, until there are no more groups of partitions. It is assumed in this example that each group of partitions fits on one processor. However, this is only one example. Any mapping policy may be used, and another policy is described hereinafter.

Figure 17A:
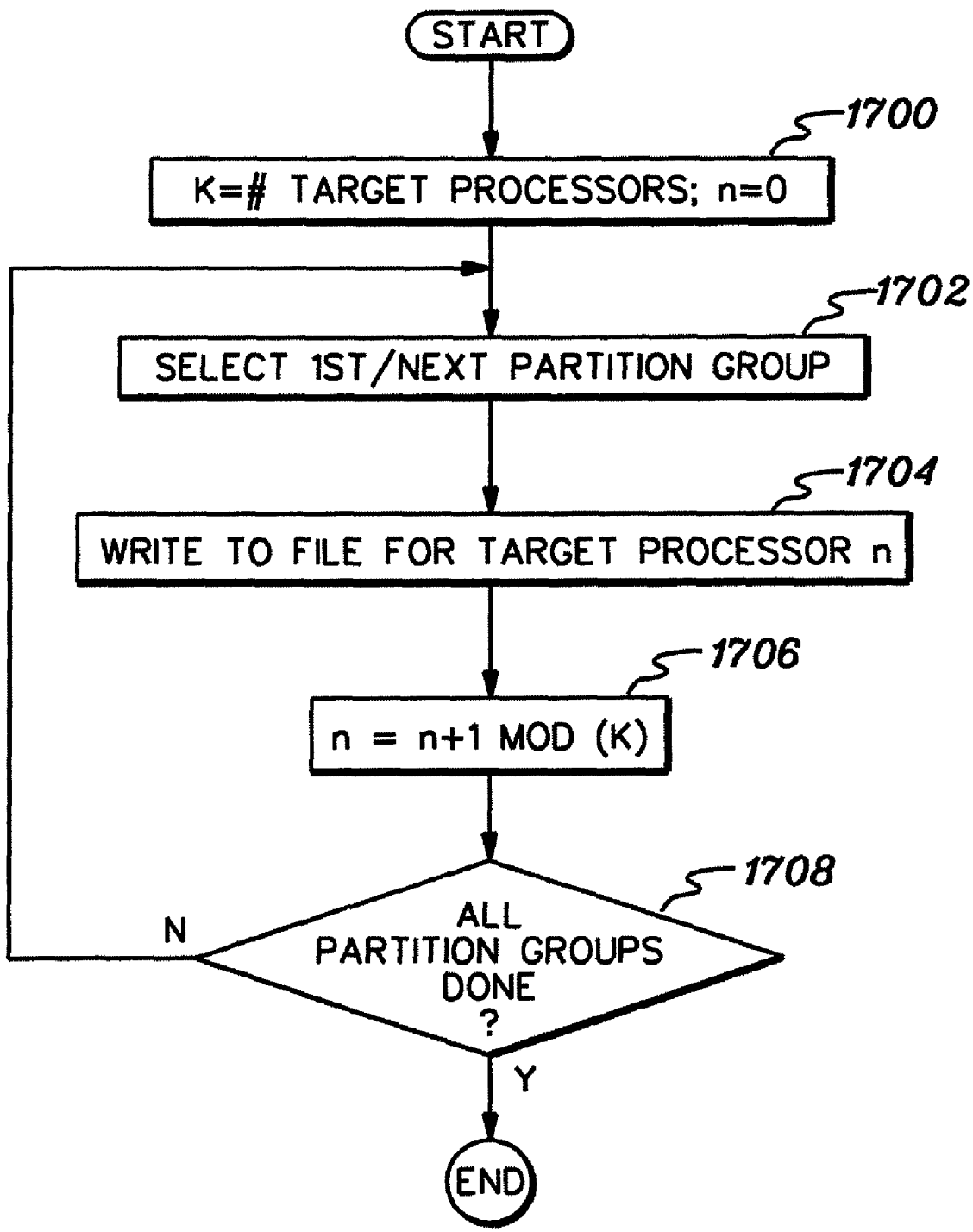
FIGS. 17a-17b depict examples of logic associated with mapping the groups of primary partitions to target processors, in accordance with an aspect of the present invention.

Referring to FIG. 17a, initially, a variable referred to as K is set to the desired number of target processors, and another variable, N, is set to zero, STEP 1700. Thereafter, a group of primary partitions (e.g., the first group) is selected, STEP 1702, and a write of each primary partition of the group to a file for target processor N is performed, STEP 1704. Next, N is increased, STEP 1706. In one example, N is increased by a value of N+1 mod (K). Subsequently, a determination is made as to whether all of the groups of partitions have been mapped to target processors, INQUIRY 1708. If not, then processing continues with STEP 1702. When all of the primary partition groups have been mapped to the target processors, then the mapping logic is complete.

Another example of mapping the groups of primary partitions to processors is described with reference to FIG. 17b. The example described with reference to FIG. 17b takes into consideration the fact that a group of primary partitions may be too large to fit on one processor or that it is desirous to spread the groups of partitions among various processors. One embodiment of the logic associated with another mapping policy is described with reference to FIG. 17b.

Initially, a variable referred to as K is set to the desired number of target processors, and another variable, N, is set to zero, STEP 1720. Thereafter, a group of primary partitions (e.g., the first group) is selected, STEP 1722, and a desired number of partitions (X) of that group is assigned to processor N, STEP 1724. In one example, this assigning includes writing each of the selected partitions of the group to a file for target processor N. In one embodiment, the number of partitions chosen is equal to a number that is known to fit on each of the processors.

Subsequently, a determination is made as to whether there are more partitions of the selected group, INQUIRY 1726. If there are more partitions, then N is incremented, STEP 1728. In one example, N is set equal to N+1 Mod (K). Processing then continues with STEP 1724. However, if there are no more partitions of the group, then a further determination is made as to whether there are more groups to be mapped to processors, INQUIRY 1730. If there are more groups, then N is incremented once again, STEP 1732, and processing continues with STEP 1722. Otherwise, the mapping of primary partitions to processors is complete.

Figure 17B:
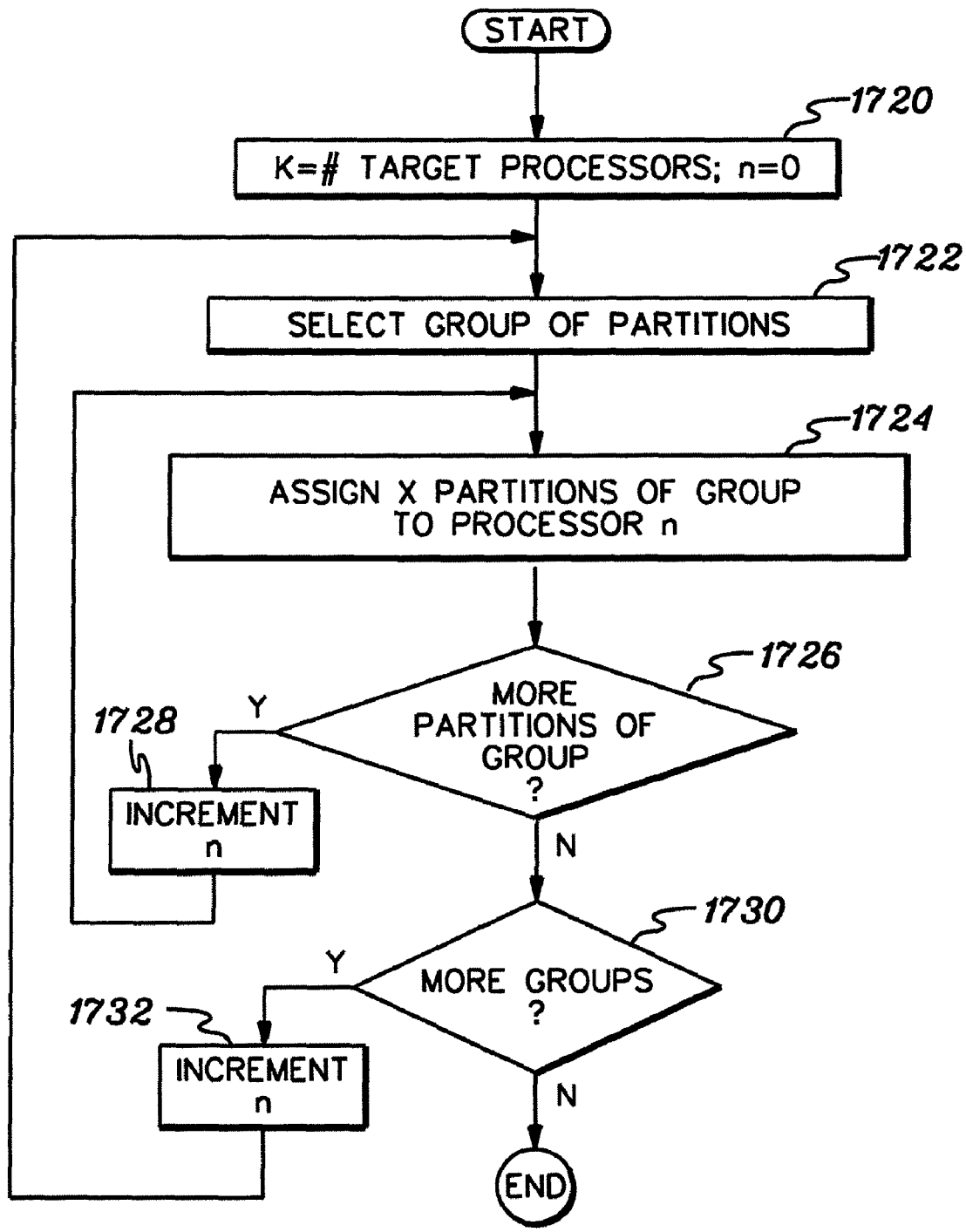

The logic described in FIG. 17b can be used for many purposes. For example, that mapping policy may be used, when the assignment of partitions is based on the maximum load for a target processor and the load needed for each clock domain. For example, assume the maximum load for each target processor equals 55 units, in which units represent, for instance, the memory space to hold the simulation model. Then, further assume each domain requires the following number of units:

| Domain | Units | Number of Processors |
|---|---|---|
| C1 | 100 | 2 |
| C2 | 200 | 4 |
| C3 | 400 | 8 |
| C4 | 75 | 2 |
| C5 | 40 | 1 |

Thus, in the above example, 17 processors are to be used. Therefore, the logic of FIG. 17b can be used to map the partitions to the 17 processors. (One caveat of the mapping is that any processors that have partitions that are to communicate with partitions on other processors are to be coupled to one another.)

In addition to mapping the functional logic of the chip, other logic, if any, such as clock and maintenance logic, is also mapped. The partitioning of the clock and maintenance logic produced one or more clock partitions corresponding to the one or more groups of partitions, as well as a common set of clock and maintenance logic. Each of the one or more clock partitions is assigned to the processor of its associated partition group, and the common set of logic is distributed across all the processors.

One embodiment of the logic associated with mapping the clock and maintenance logic is described with reference to FIGS. 18a-18b. In one example, this logic is processed for each target processor.

Figure 18A:
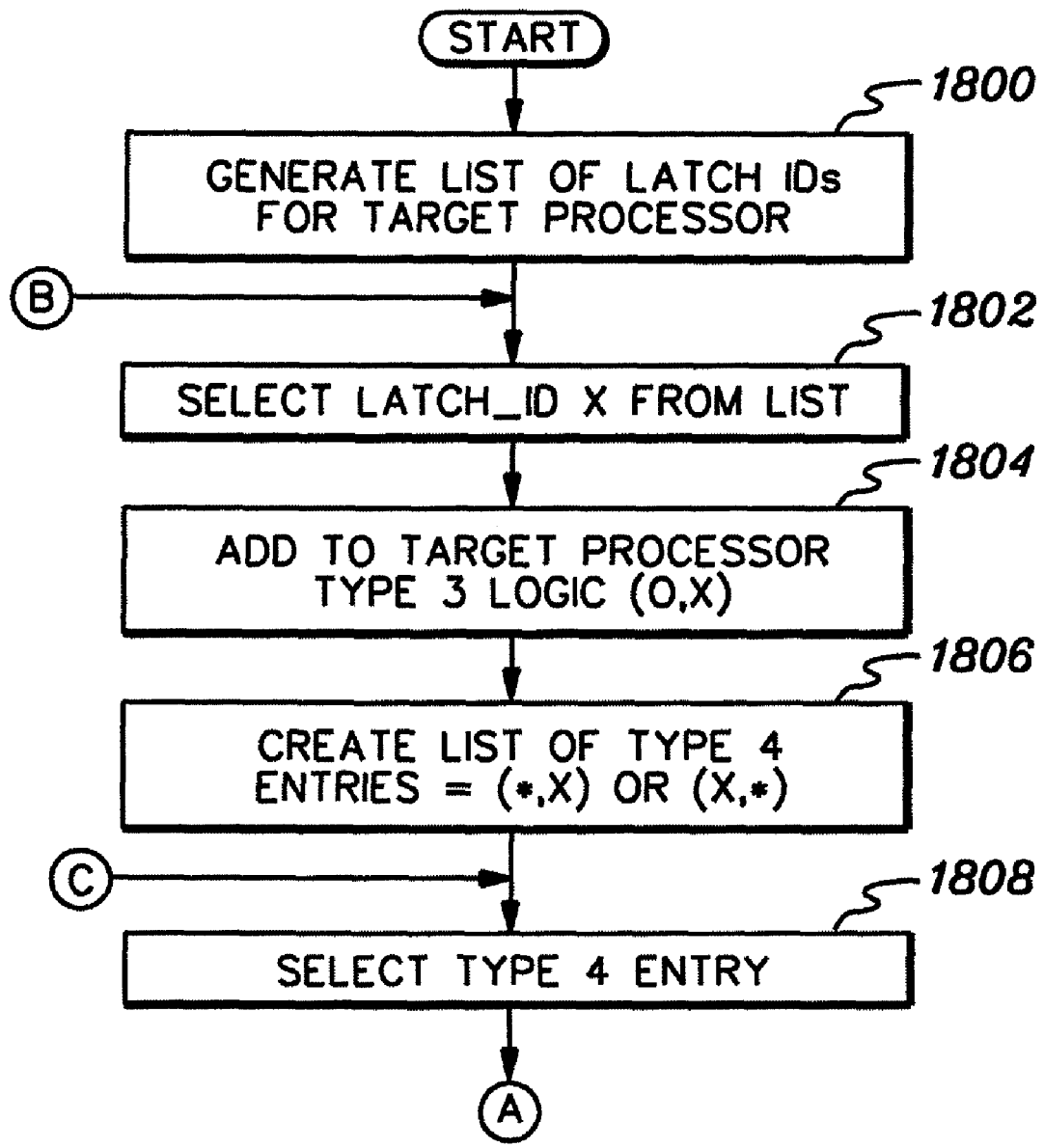
FIGS. 18a-18b depict one embodiment of the logic associated with mapping the clock and maintenance logic to the target processors, in accordance with an aspect of the present invention.
Figure 18B:
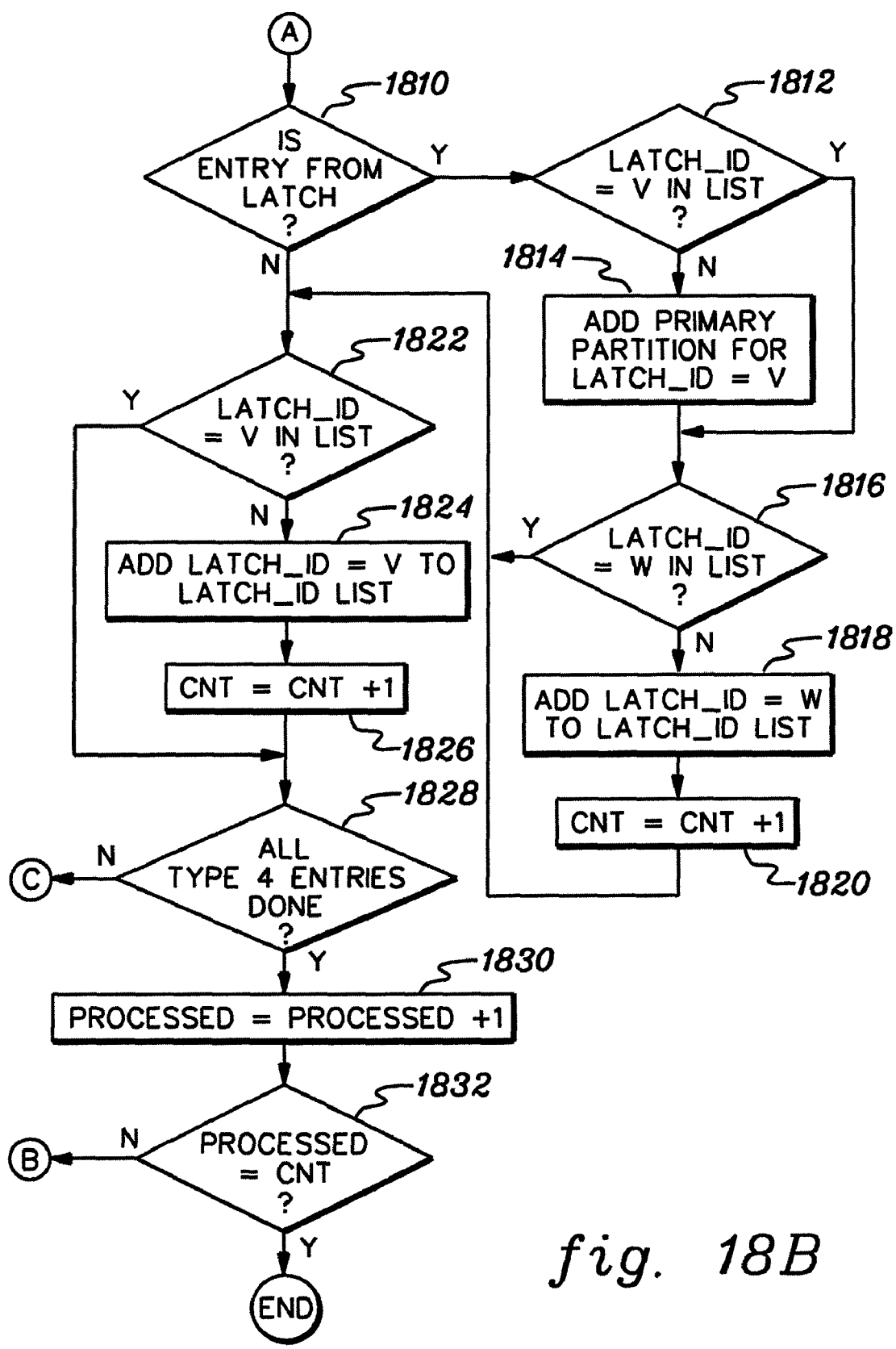

Referring to FIG. 18a, initially, a list of latch ids for the selected target processor is generated, STEP 1800. This list is a composite list of LATCH_ID's from each primary partition that has been mapped to the target processor in STEP 408 of FIG. 4. Thereafter, a latch id (e.g., LATCH_ID X) is selected from the list to be processed, STEP 1802.

In processing LATCH_ID X, Type 3 logic (0,X) for the selected latch id is added to the target processor, STEP 1804. In one example, this includes writing the partition specific clock logic to the target processor. Additionally, a list of Type 4 entries (*,X) or (X,*) is created for that LATCH_ID, STEP 1806. Next, a Type 4 entry is selected, STEP 1808, and a determination is made as to whether the entry is from a latch, STEP 1810 (FIG. 18b). If the entry is from a latch, then a further determination is made as to whether the LATCH_ID is already in the target processor's LATCH_ID list, INQUIRY 1812. For instance, a determination is made as to whether LATCH_ID=V is in the list, where the tuple V,W represents LATCH_ID, CLK_ID of the Type 4 entry selected in STEP 1808. If LATCH_ID=V is not in the list, then the primary partition for LATCH_ID=V is added to the target processor's list, STEP 1814. This enables functional logic of latches that are driving clocks to be included in the mapping of clock/maintenance logic to the target processor.

Thereafter, or if LATCH_ID=V is in the list, then a further determination is made as to whether LATCH_ID=W is in the list, INQUIRY 1816. If LATCH_ID=W is not in the list, then LATCH_ID=W is added to the LATCH_ID list of the target processor, STEP 1818, and a variable referred to as CNT is incremented by one, STEP 1820.

Thereafter, or if LATCH_ID=W is in the list, a determination is made as to whether LATCH_ID=V is in the list, INQUIRY 1822. If LATCH_ID=V is not in the list, then LATCH_ID=V is added to the LATCH_ID list, STEP 1824, and CNT is incremented by one, STEP 1826. Subsequently, or if LATCH_ID=V is in the list, then a determination is made as to whether the Type 4 entries have been processed, INQUIRY 1828. If there remains Type 4 entries to be processed, then processing continues with STEP 1808. Otherwise, a variable referred to as Processed is incremented by one, STEP 1830.

Next, a determination is made as to whether Processed is equal to CNT, INQUIRY 1832. If Processed is not equal to CNT, then processing continues with STEP 1802. Otherwise, the clock/maintenance logic mapping for the selected target processor is complete.

The partitioning protocol described above simplifies one or more management aspects of distributed simulation. As one example, global management associated with GST is simplified. This is true for both of the policies used to adjust the clock domains. In one example, the GST management is simplified to a point in which the global simulation time is provided by the global manager, but management of the progression of the GST is locally managed. Thus, the global manager need not get involved in the event management.

Figure 19A:
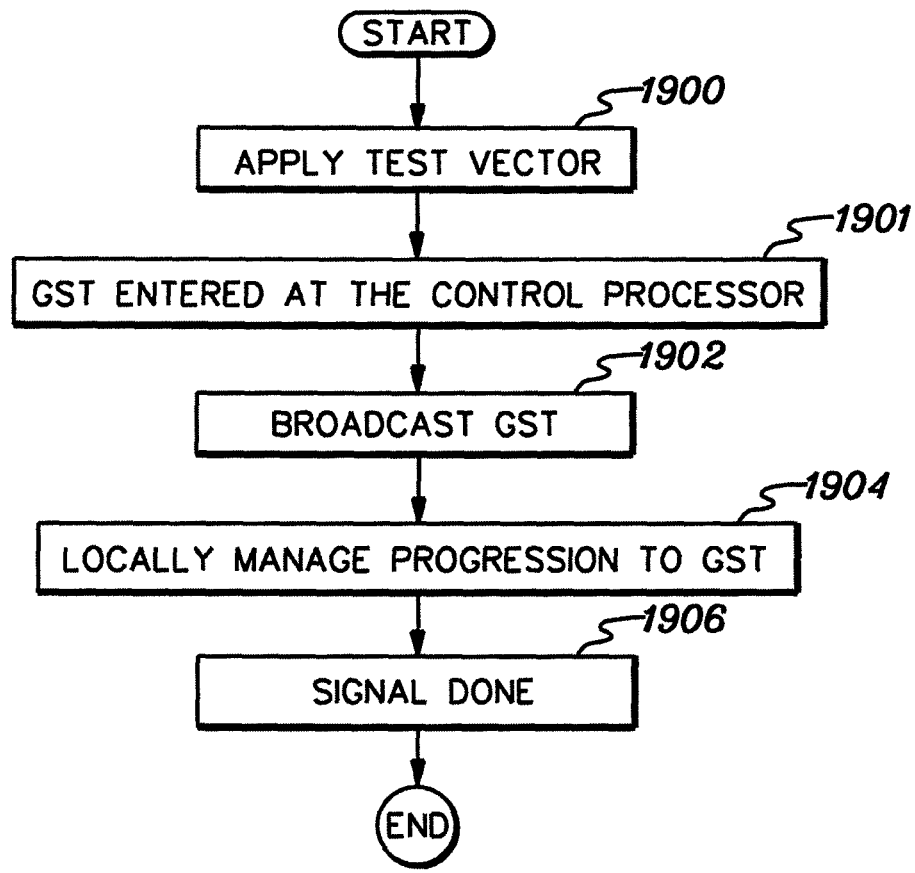
FIGS. 19a-19b depict one embodiment of the logic associated with managing global simulation time, in accordance with an aspect of the present invention.
Figure 19B:
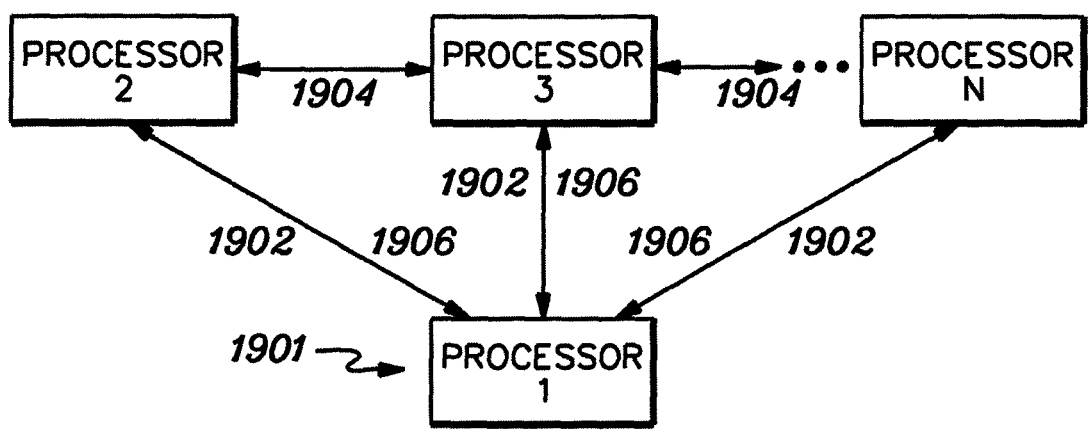

One embodiment of the logic illustrating the simplified global management associated with GST is described with reference to FIGS. 19a and 19b. Initially, during simulation, a test stimuli is applied to the primary inputs of the chip, such that results can be observed at the primary outputs, STEP 1900. This stimuli is applied by, for instance, one of the processors selected to control the simulation.

Thereafter, the GST (e.g., X time units) is entered at the control processor, STEP 1901, and the control processor broadcasts the GST to the other processors running the simulation, STEP 1902. Then, the processors receiving the broadcast locally manage their progression to the GST, STEP 1904. For example, each processor advances its simulation time as it executes the simulation behavior (not waiting for data from another processor) until the processor simulation time equals the GST. The progression to GST is locally managed by each processor using periodic simulation time intervals to exchange data with other processors, as described below. Synchronization and coherency of data across processors are maintained by halting the advancement of the processor simulation time during a data exchange. As each of the processors completes its progression to the GST, it signals the control processor that it is complete, STEP 1906. At this point, the simulation can be complete or processing can continue at STEP 1900.

Management associated with the global simulation time is now locally managed. This management includes knowing, for each clock domain, the point at which data is to be exchanged relative to the clock edge. Since each partition generates the same clocks internally, the point is the same for the latch data exchanges of that domain across the network. Thus, a simple handshake mechanism is employed. This mechanism includes, for instance, sending the data to the other side, and waiting for data from the other side. These routines execute in real-time without advancing the simulation time, so as far as simulation is concerned, the exchange is instantaneous. Synchronization is maintained by not allowing GST to advance until the current data exchange is complete.

In one embodiment, a common point for exchanging data is derived that can be treated as a global exchange point between latches for a given clock domain, even when actual timing delays skew clock arrival times. This ensures, for one example, that a single GST interval can be used for each resulting clock domain, reducing global GST management complexity. Further, this allows a mapping of cycle time semantics onto an event simulation with actual delays, such that global sequencing is simplified, while continuing to exploit the extended capabilities of event simulation (real-timing delays).

In accordance with aspects of the present invention, two types of designs may be employed to provide the common point. One is considered a double latch design and the other is considered a single latch design. One example of the double latch design is described with reference to FIG. 20*a*, and one example of the single latch design is described with reference to FIG. 20*b*.

Figure 20A:
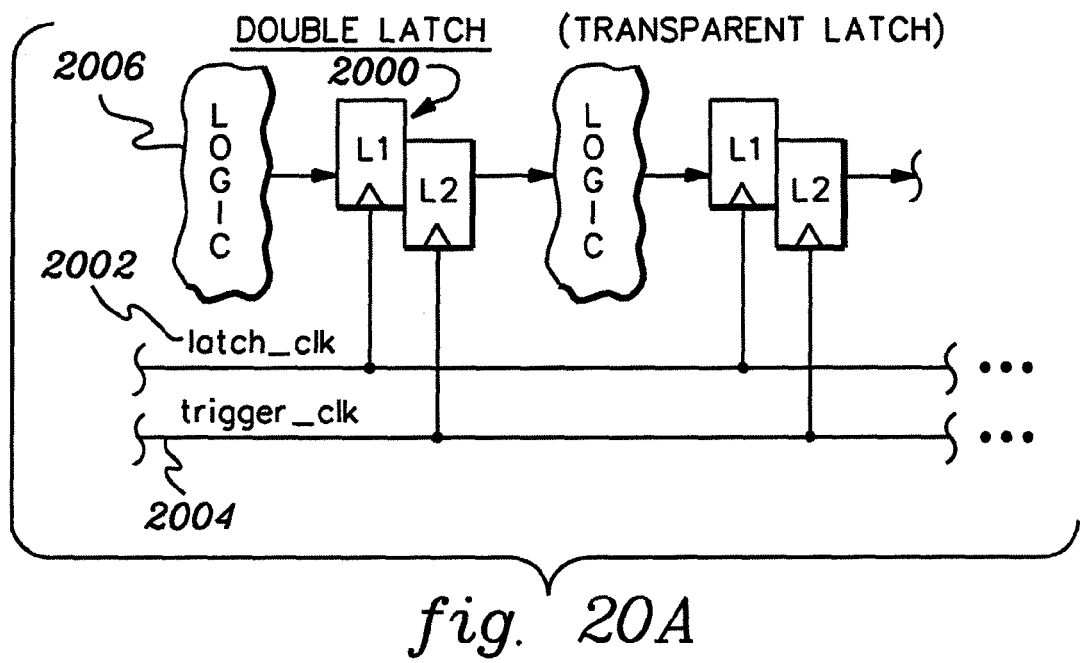
FIGS. 20a-20b pictorially depict transfer points used in exchanging data between latches, in accordance with an aspect of the present invention.

As shown in FIG. 20*a*, a double latch 2000 includes two separate clocks, a latch clock 2002 and a trigger clock 2004. Latch clock 2002 catches data for logic 2006, and trigger clock 2004 takes the data that is provided from L1 and launches it to the next double latch. The trigger clock is used to determine the selection of a point. The selection of a point is described in further detail below.

Figure 20B:
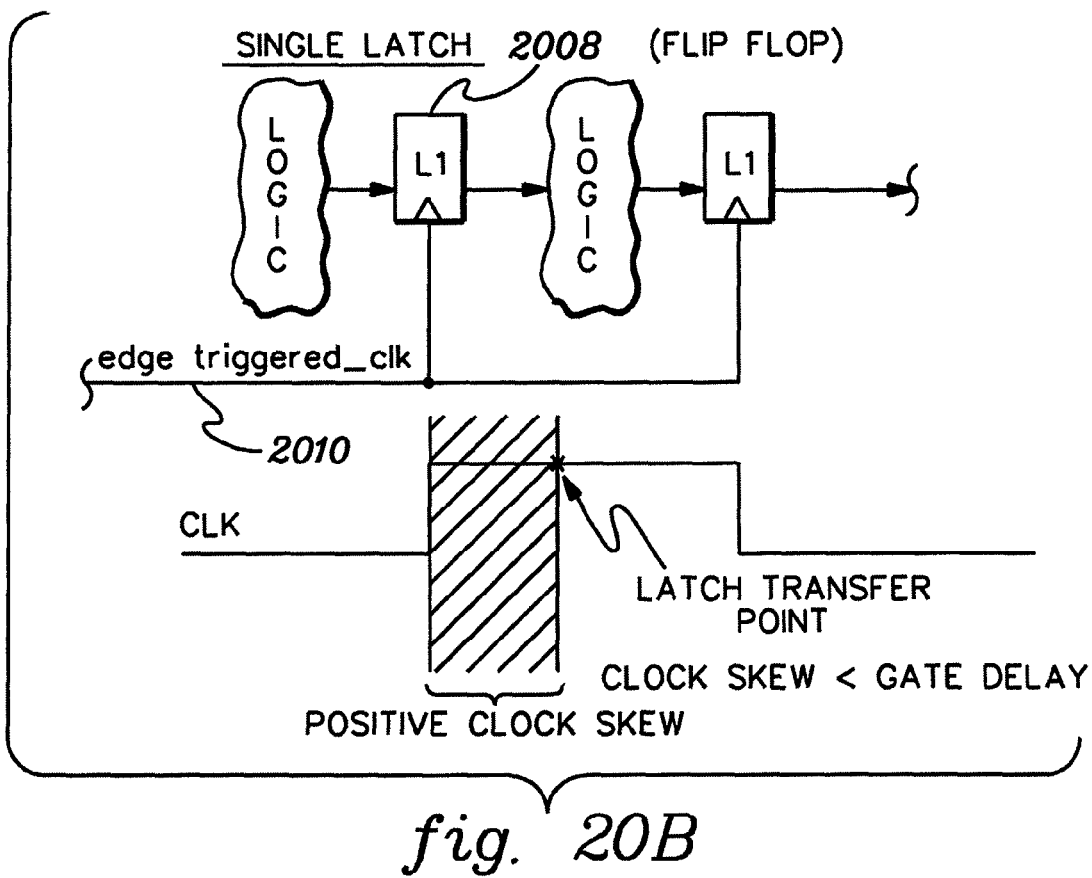

A single latch design is depicted in FIG. 20*b*. In this design, a single latch 2008 has an edge triggered clock 2010, which is used in transferring the data between the latches, as described below.

For instance, in both the single and double latch designs, a maximum clock skew is obtained, which is considered the maximum time delay for the worst case. Therefore, the optimal point is selected as the maximum positive clock skew point. It is at this point that it can be assured that all the clocks to the interface latches should have arrived, either earlier or later than the reference point. This is explained in further detail with reference to FIGS. 21 and 22*a*-22*b*.

Figure 21:
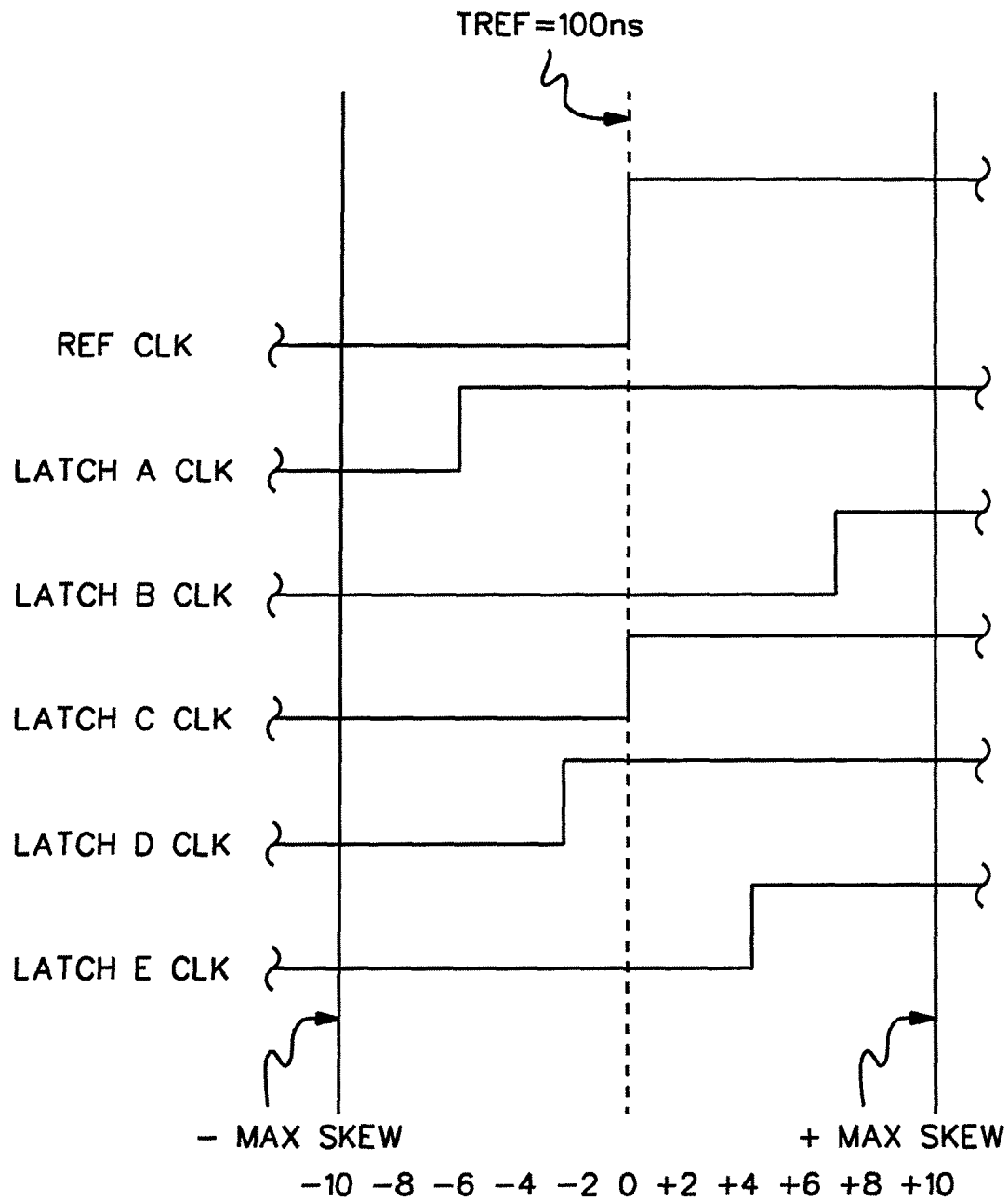
FIG. 21 depicts examples of various clocks and the clock skew associated with those clocks, in accordance with an aspect of the present invention.

Depicted in FIG. 21 are a plurality of clocks (e.g., five) corresponding to a plurality of latches (Latch A-Latch E) and a reference clock. The reference clock is considered the ideal clock having no clock skew. As shown, the clocks to the latches arrive at varying times, and these varying times are to be taken into consideration in the exchanging of data between latches. For example, Latch A is shown to arrive earlier than the reference clock, while Latch B is shown to arrive later. This is due to clock skew. In the example shown above, the maximum clock skew is plus or minus 10, which is a system parameter. Thus, although there are variable clock skews, one sample point at, for instance, positive Max Skew, is selected.

Since there are varying clock skews, various clock data are employed in order to ensure that the transfer of data across the network is as if the transfer was between internal latches. One embodiment of various clock data associated with Latches A-E is summarized in the below table.

| | Delay Rise | Delay Fall | $T_{CLK}$ | $T_{OUT}$ Rise | $T_{OUT}$ Fall | Max Skew | $T_{ADJ}$ Rise | $T_{ADJ}$ Fall |
|---|---|---|---|---|---|---|---|---|
| Latch A | 0.1 | 0.095 | 99.994 | 100.094 | 100.089 | 0.01 | 0.084 | 0.079 |
| Latch B | 0.11 | 0.098 | 100.008 | 100.118 | 100.106 | 0.01 | 0.108 | 0.096 |
| Latch C | 0.12 | 0.1 | 100 | 100.12 | 100.1 | 0.01 | 0.11 | 0.09 |
| Latch D | 0.125 | 0.11 | 99.998 | 100.123 | 100.108 | 0.01 | 0.113 | 0.108 |
| Latch E | 0.115 | 0.1 | 100.004 | 100.119 | 100.104 | 0.01 | 0.109 | 0.094 |

Delay Rise and Delay Fall are delay times to the interface latches. In accordance with an aspect of the present invention, these values are obtained by calibration that takes place at the beginning of the simulation. For example, the simulator forces the data to zero and one, induces a clock event at the latch, and measures the delay for the data to change at the output, such that Delay Rise and Delay Fall are automatically determined without any need to reference the delay data.

$T_{CLK}$ is an absolute time that is dynamically determined. Examples of TCLK are shown in FIG. 21. For instance, the TCLK for Latch A is 99.994 ns, since Latch A has a skew of −0.006 and the reference point is 100 ns (100−0.006=99.994).

$T_{OUT}$ Rise and $T_{OUT}$ Fall are calculated using the following formula, as one example: $T_{OUT}$ Rise/Fall=$T_{CLK}$+Delay Rise/Fall.

Max skew is a system parameter provided by the simulator that indicates the maximum variation in the clock. In this example, it is +0.010.

$T_{ADJ}$ Rise and $T_{ADJ}$ Fall are calculated using, for instance, the following formula: $T_{ADJ}$ Rise/Fall=$T_{OUT}$ Rise/Fall−$T_{REF}$−Max Skew.

Using the above information, it is possible to select a sample point when all the clocks are stable. This selected point is at the Max Skew, as one example. Further, using this capability, a clock event in which data is transferred to the next input latch occurs at the same time for a network connection, as it would for an internal connection. This is shown in FIGS. 22*a*-22*b*.

Figure 22A:
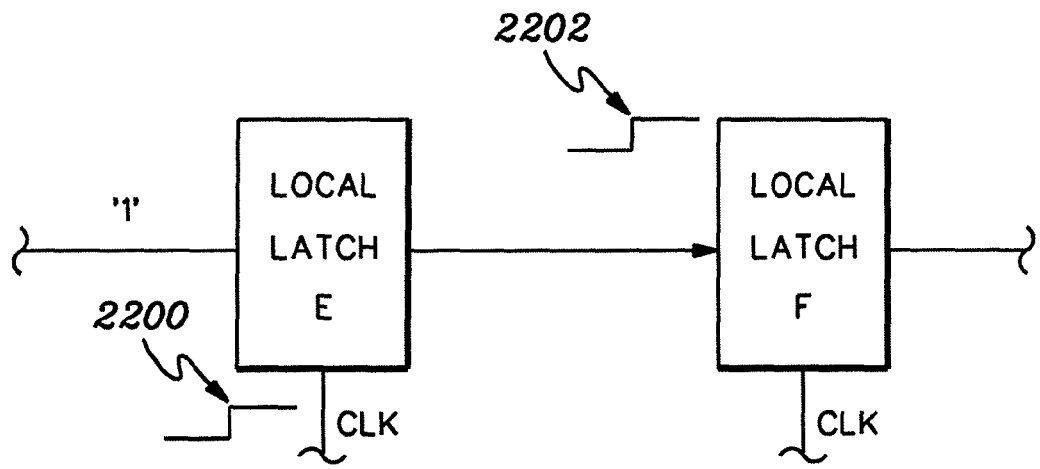
FIG. 22a depicts a clock event for a non-partitioned model.
Figure 22B:
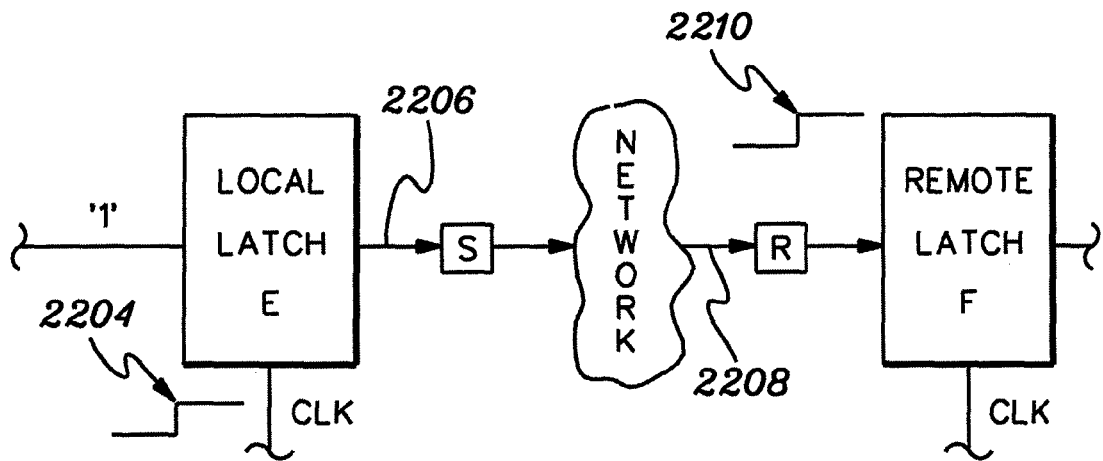
FIG. 22b depicts a clock event for a partitioned model, in accordance with an aspect of the present invention.

In FIG. 22*a*, a clock event associated with Latch E is depicted, in which data is transferred internally (e.g., single image) from Latch E to Latch F. At the rise of the clock (2200), the time ($T_{CLK}$) is 100.004. This is the time when the clock is enabled. However, due to internal latch delay (Delay Rise), the output is not available at the next latch until time 100.119 (2202).

Similarly, when the chip is partitioned (FIG. 22*b*) and the data is going across the network, the time that it arrives is still 100.119. For example, the clock is once again enabled at 100.004 (2204). At the clock rise, the data and $T_{ADJ}$ are sent to the network (2206), and the time is 100.010 ($T_{REF}$+Max Skew). At 2208, the data and $T_{ADJ}$ are received from the network, and again the time is 100.010. Then, at 2210, the output is available at the remote latch (2210) at time 100.119, after a $T_{ADJ}$ delay. Thus, it can be seen that the clock event happens at the same time (e.g., 100.119) regardless of whether there is partitioning.

Described in detail above is a capability for facilitating distributed simulation of a model. In some cases, sophisticated test benches are used for the simulation, which typically have models written in VHDL to drive chip primary inputs and observe primary outputs. These models are written using abstract programming constructs that do not easily map to latches and gates. Further, the test bench paradigm allows for applying stimuli and observing results at any time, and thus, data is not necessarily exchanged at fixed points in a clock period. Thus, in one example, the abstract VHDL driver or monitor code is treated as a large combinatorial gate. Since the driver and monitor interface with all of the primary inputs and primary outputs, one aspect of the capability of the present invention automatically aggregates logic associated with the primary inputs and primary outputs into a common primary partition, such that the primary inputs and primary outputs can be manipulated asynchronously within a node. This advantageously enables the integration of abstract models into the above design. Further, since drivers and monitors are abstractly defined, less VHDL code is needed to define their operation, such that this code can easily fit in the single node. (This node also lends itself well as a control node for the simulation.)

Advantageously, one or more aspects of the present invention facilitate distributed simulation of a model. In one example, a partitioning capability is provided that facilitates the simulation, including simplifying various management aspects associated with the simulation. For instance, global management associated with global simulation time is facilitated. As examples, global management of GST is facilitated by eliminating asynchronous clock boundaries across the network and/or by exchanging data across the network on latch boundaries.

In one embodiment, the partitioning is performed automatically and does not require user directives of where or how to partition.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A system of managing simulation of a model, said system comprising:
    a plurality of partition groups of a model to be simulated, said plurality of partition groups corresponding to a plurality of clock domains;
    at least one processor to derive an exchange point to be used in exchanging data between two partition groups of the plurality of partition groups on at least one latch boundary;
    at least one processor to exchange data between the two partition groups, wherein one partition group of the two partition groups comprises one latch having one clock associated therewith and another partition group of the two partition groups comprises another latch having another clock associated therewith, wherein the one clock arrives at the one latch at one time and the another clock arrives at the another latch at another time, the one time varying from the another time, and wherein the respective times are preserved in exchanging the data; and
    at least one processor to advance a global simulation time, in response to the exchanging of data, the global simulation time controlling a progression of simulation of the model.

2. The system of claim 1, further comprising at least one processor to adjust one or more partition groups of the plurality of partition groups, wherein the adjusting for a partition group of the one or more partition groups includes moving at least a portion of a partition group of the plurality of partition groups to the partition group of the one or more partition groups, and wherein the at least a portion of the partition group being moved is of a partition group that interfaces with the partition group being adjusted.

3. The system of claim 2, wherein the partition group having the at least a portion being moved has a slower clock frequency than the partition group receiving the at least a portion.

4. The system of claim 2, wherein the at least a portion of the partition group being moved is of a partition group corresponding to an optimal clock domain of the plurality of clock domains.

5. The system of claim 1, wherein the plurality of partition groups are to be processed on a plurality of processors, and wherein data exchanged between partition groups on different processors is across one or more synchronous clock boundaries.

6. The system of claim 1, wherein said model is to be simulated in a distributed environment.

7. The system of claim 1, further comprising at least one processor to determine at least one adjustment, said at least one adjustment used in preserving the respective times.

8. The system of claim 7, wherein the adjustment comprises at least one of a $T_{ADJ}$Rise or a $T_{ADJ}$Fall, wherein $T_{ADJ}$Rise/Fall=$T_{OUT}$Rise/Fall-$T_{REF}$-Max Skew where: $T_{OUT}$Rise/Fall=$T_{CLK}$+Delay Rise/Fall, Delay Rise/Fall are delay times to interface latches, $T_{CLK}$ is an absolute time, Max Skew is maximum clock skew, which is a system parameter, and $T_{REF}$ is time of a reference clock.

9. At least one program storage device readable by a machine tangibly embodying at least one program of instructions executable by the machine to perform a method of managing simulation of a model, said method comprising:
    obtaining a plurality of partition groups of a model to be simulated, said plurality of partition groups corresponding to a plurality of clock domains;

deriving an exchange point to be used in exchanging data between two partition groups of the plurality of partition groups on at least one latch boundary;

exchanging data between the two partition groups, wherein one partition group of the two partition groups comprises one latch having one clock associated therewith and another partition group of the two partition groups comprises another latch having another clock associated therewith, wherein the one clock arrives at the one latch at one time and the another clock arrives at the another latch at another time, the one time varying from the another time, and wherein the respective times are preserved in exchanging the data; and advancing a global simulation time, in response to the exchanging of data, the global simulation time controlling a progression of simulation of the model.

10. The at least one program storage device of claim 9, further comprising adjusting one or more partition groups of the plurality of partition groups, wherein said adjusting for a partition group of the one or more partition groups includes moving at least a portion of a partition group of the plurality of partition groups to the partition group of the one or more partition groups, and wherein the at least a portion of the partition group being moved is of a partition group that interfaces with the partition group being adjusted.

11. The at least one program storage device of claim 10, wherein the partition group having the at least a portion being moved has a slower clock frequency than the partition group receiving the at least a portion.

12. The at least one program storage device of claim 10, wherein the at least a portion of the partition group being moved is of a partition group corresponding to an optimal clock domain of the plurality of clock domains.

13. The at least one program storage device of claim 9, wherein the plurality of partition groups are to be processed on a plurality of processors, and wherein data exchanged between partition groups on different processors is across one or more synchronous clock boundaries.

14. The at least one program storage device of claim 9, wherein said model is to be simulated in a distributed environment.

15. The at least one program storage device of claim 9, further comprising determining at least one adjustment, said at least adjustment used in preserving the respective times.

16. The at least one program storage device of claim 15, wherein the adjustment comprises at least one of a $T_{ADJ}$Rise or a $T_{ADJ}$Fall, wherein $T_{ADJ}$Rise/Fall=$T_{OUT}$Rise/Fall−$T_{REF}$−Max Skew where: $T_{OUT}$Rise/Fall=$T_{CLK}$+Delay Rise/Fall, Delay Rise/Fall are delay times to interface latches, $T_{CLK}$ is an absolute time, Max Skew is maximum clock skew, which is a system parameter, and $T_{REF}$ is time of a reference clock.

\* \* \* \* \*